(12) United States Patent
Nowak et al.

(10) Patent No.: US 9,373,678 B2
(45) Date of Patent: Jun. 21, 2016

(54) NON-PLANAR CAPACITORS WITH FINELY TUNED CAPACITANCE VALUES AND METHODS OF FORMING THE NON-PLANAR CAPACITORS

(71) Applicant: International Business Machines Corporation, Armonk, NY (US)

(72) Inventors: Edward J. Nowak, Essex Junction, VT (US); Richard Q. Williams, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 151 days.

(21) Appl. No.: 14/306,294

(22) Filed: Jun. 17, 2014

(65) Prior Publication Data

US 2015/0364534 A1   Dec. 17, 2015

(51) Int. Cl.
| | |
|---|---|
| *H01L 21/20* | (2006.01) |
| *H01L 27/06* | (2006.01) |
| *H01L 49/02* | (2006.01) |
| *H01L 29/78* | (2006.01) |
| *H01L 29/66* | (2006.01) |
| *H01L 21/308* | (2006.01) |
| *H01L 21/84* | (2006.01) |
| *H01L 27/12* | (2006.01) |

(52) U.S. Cl.
CPC ............ *H01L 28/40* (2013.01); *H01L 21/3086* (2013.01); *H01L 21/845* (2013.01); *H01L 27/0629* (2013.01); *H01L 28/60* (2013.01); *H01L 29/66795* (2013.01); *H01L 29/785* (2013.01); *H01L 27/1207* (2013.01)

(58) Field of Classification Search
CPC ... H01L 28/40; H01L 28/60; H01L 29/66795; H01L 29/785; H01L 27/0629; H01L 27/1211; H01L 27/0805; H01L 21/845; H01L 21/823821
See application file for complete search history.

(56) References Cited

U.S. PATENT DOCUMENTS

| | | | |
|---|---|---|---|
| 4,210,950 A | 7/1980 | Fraser, Jr. et al. | |
| 6,664,582 B2 * | 12/2003 | Fried ................. | H01L 27/10876 257/308 |
| 6,842,327 B1 | 1/2005 | Diorio et al. | |

(Continued)

FOREIGN PATENT DOCUMENTS

| | | |
|---|---|---|
| JP | 02-002659 | 1/1990 |
| JP | 06-32478 | 5/1994 |
| JP | 2011-014753 | 1/2011 |

*Primary Examiner* — Michael Trinh
(74) *Attorney, Agent, or Firm* — Gibb & Riley, LLC; Michael J. LeStrange, Esq.

(57) ABSTRACT

Disclosed are non-planar capacitors with finely tuned capacitances and methods of forming them. The capacitors each incorporate one or more semiconductor bodies and one or more gate stacks traversing the one or more semiconductor bodies. At least one first semiconductor body is etched so that it is shorter in length than the others, which are incorporated into other non-planar devices and/or into the same non-planar capacitor. Additionally, at least one gate stack can be formed so that it traverses a first portion and, particularly, an end portion of the shortened semiconductor body and further so that it extends laterally some distance beyond that first portion. In such capacitors, the length of the first portion of the shorted semiconductor body, which corresponds to a capacitor conductor and which is traversed by the gate stack, which corresponds to a capacitor dielectric and another capacitor conductor, is predetermined to achieve a desired capacitance.

18 Claims, 28 Drawing Sheets

(56) References Cited

U.S. PATENT DOCUMENTS

| | | |
|---|---|---|
| 7,060,553 B2 | 6/2006 | Fried et al. |
| 7,262,092 B2 | 8/2007 | Diorio et al. |
| 7,859,081 B2 | 12/2010 | Doyle et al. |
| 8,076,190 B2 | 12/2011 | Chen et al. |
| 8,207,027 B2 * | 6/2012 | Zhu ................ H01L 21/845 438/157 |
| 8,420,476 B2 | 4/2013 | Booth, Jr. et al. |
| 8,507,341 B2 * | 8/2013 | Tran ............... H01L 21/0337 257/E21.023 |
| 8,581,320 B1 | 11/2013 | Cheng et al. |
| 8,598,641 B2 | 12/2013 | Chen et al. |
| 8,610,249 B2 | 12/2013 | Di Sarro et al. |
| 2003/0193058 A1 | 10/2003 | Fried et al. |
| 2011/0175152 A1 | 7/2011 | Booth, Jr. et al. |
| 2011/0298025 A1 | 12/2011 | Haensch et al. |
| 2013/0105937 A1 * | 5/2013 | Niroomand ........ H01L 21/0338 257/499 |
| 2013/0292777 A1 * | 11/2013 | Liaw ................ G11C 11/412 257/369 |
| 2013/0309832 A1 | 11/2013 | Cheng et al. |
| 2013/0334615 A1 * | 12/2013 | Ho ................... H01L 29/785 257/401 |
| 2014/0042547 A1 | 2/2014 | Khakifirooz et al. |

\* cited by examiner

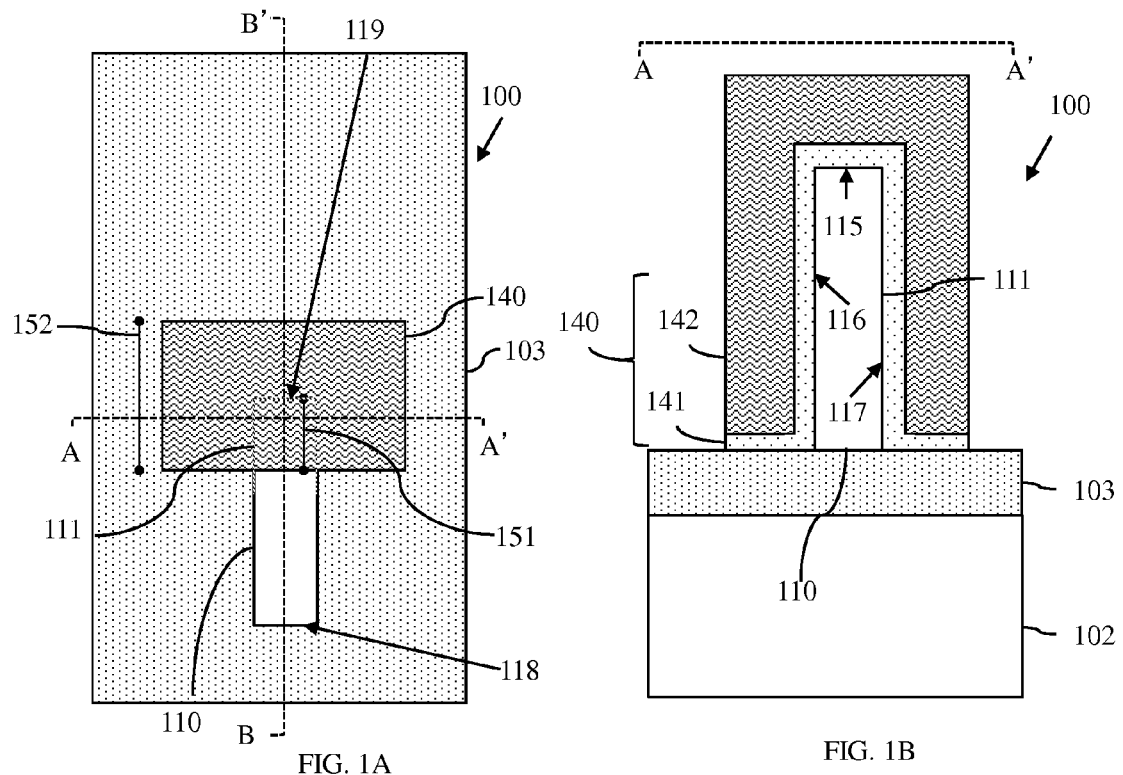
FIG. 1A
FIG. 1B
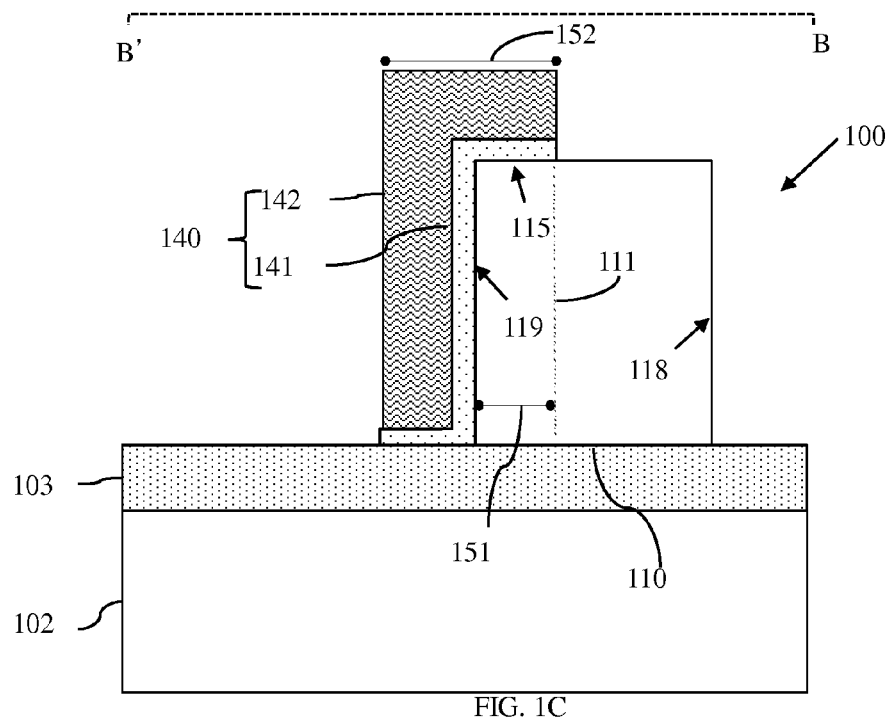
FIG. 1C

NON-PLANAR CAPACITORS WITH FINELY TUNED CAPACITANCE VALUES AND METHODS OF FORMING THE NON-PLANAR CAPACITORS

BACKGROUND

The present invention relates to capacitors and, more particularly, to non-planar capacitors with finely tuned (i.e., selectively adjusted) capacitance values and methods of forming the non-planar capacitors that can be readily integrated into the processes used in a design rule-dependent multi-gate non-planar field effect transistor (MUGFET) technology.

More specifically, integrated circuit design decisions are often driven by device scalability, device density, manufacturing efficiency and costs. For example, size scaling of planar field effect transistors (FETs) resulted in the development of planar FETs with relatively short channel lengths and, unfortunately, the smaller channel lengths resulted in a corresponding increase in short channel effects and a decrease in drive current.

In response, different types of multi-gate non-planar field effect transistor (MUGFET) technologies, such as fin-type FET (FINFET) technologies (also referred to herein as a dual gate non-planar FET technologies) and tri-gate non-planar FET technologies, have been developed. A FINFET is a non-planar FET comprising a relatively thin semiconductor body (typically referred to as a semiconductor fin) with top surface and opposing sidewalls and a channel region positioned laterally between source/drain regions. A gate stack is adjacent to the top surface and opposing sidewalls of the semiconductor body at the channel region. Since the semiconductor body of this FINFET is relatively thin, the FINFET essentially exhibits only two-dimensional field effects. That is, field effects are exhibited at the opposing sidewalls, but because the semiconductor body is so thin any field effects exhibited at the top surface are insignificant (i.e., negligible). A tri-gate non-planar FET is similar in structure to a FINFET. However, the semiconductor body of a tri-gate non-planar FET is relatively wide and, thus, the tri-gate non-planar FET exhibits three-dimensional field effects. Typically, multiple semiconductor bodies and/or multiple gate stacks will be incorporated into a given MUGFET structure in order to increase drive current as well as device density.

Additionally, since many integrated circuit designs require capacitors in addition to transistors, non-planar capacitors have also been developed along with methods of forming these non-planar capacitors. Generally, however, the processes used to form non-planar capacitors cannot readily be integrated into the processes used to form MUGFETs. Furthermore, the above-described MUGFET technologies are often design rule-dependent. That is, in a given MUGFET technology, the design rules require semiconductor bodies to be formed such that they are positioned laterally adjacent to each other (e.g., parallel to each other, substantially parallel to each other, slightly angled relative to each other so as to form a chevron pattern, etc.) and essentially identical in length, width, and height and such that the pitch is essentially uniform with the height being greater than ½ the pitch to ensure a relatively high current density as compared to a planar FET. Similarly, the design rules require gate stacks to be formed such that they traverse one or more of the semiconductor bodies and are essentially identical in length and height relative to the one or more semiconductor bodies and such that the gate pitch is essentially uniform. Thus, even when the processes used to form non-planar capacitors are integrated into the processes used to form MUGFETS, the capacitance values of the resulting non-planar capacitors are quantized (i.e., fixed) due to the layout requirements. Therefore, there is a need in the art for a non-planar capacitor with a finely tuned (i.e., selectively adjusted) capacitance value and a method of forming the non-planar capacitor that can be readily integrated into the processes used in a design-rule dependent multi-gate non-planar field effect transistor (MUGFET) technology.

SUMMARY

In view of the foregoing, disclosed herein are non-planar capacitors with finely tuned (i.e., selectively adjusted) capacitances and methods of forming these non-planar capacitors that can be readily integrated into the processes used in a design rule-dependent multi-gate non-planar field effect transistor (MUGFET) technology. The non-planar capacitors can each incorporate one or more semiconductor bodies and one or more gate stacks traversing the one or more semiconductor bodies. In such non-planar capacitors, any portion of a semiconductor body traversed by a gate stack functions as a first capacitor conductor and the gate stack comprises a dielectric layer that functions as a capacitor dielectric and a conductor layer that functions as a second capacitor conductor. In the non-planar capacitors disclosed herein at least one first semiconductor body can be etched so that it is shorter in length than other semiconductor bodies, which are incorporated into other non-planar devices and/or into the same non-planar capacitor. Additionally, at least one gate stack can be formed so that it traverses a first portion and, particularly, an end portion of the shortened first semiconductor body and further so that it extends laterally some distance beyond that first portion. In such non-planar capacitors, the length of the first portion of the first semiconductor body, which corresponds to the first capacitor conductor and which is traversed by the gate stack, can be predetermined in order to achieve a desired capacitance.

More particularly, disclosed herein are non-planar capacitors including, for example, single-body single-gate non-planar capacitors as well as more complex non-planar capacitors, such as multi-body, single-gate or multi-gate finger, non-planar capacitors.

Each non-planar capacitor can comprise an isolation layer and at least a first semiconductor body above the isolation layer. The first semiconductor body can be shorter in length than other semiconductor bodies that are incorporated into either an adjacent device (e.g., an adjacent non-planar capacitor or an adjacent multi-gate field effect transistor (MUGFET)) or the same non-planar capacitor.

Each non-planar capacitor can further comprise a gate stack that traverses a first portion and, particularly, an end portion of the first semiconductor body. That is, the first semiconductor body, which, as mentioned above, is relatively short in length, can have a first top surface, first opposing sidewalls and first opposing endwalls. The first portion of the first semiconductor body (i.e., the end portion of the first semiconductor body that is traversed by the gate stack) can have a first length and the gate stack can have a second length that is greater than the first length. Thus, the gate stack can be positioned adjacent to the first portion of the first semiconductor body on the first top surface, on the first opposing sidewalls and on one of the first opposing endwalls and the gate stack can further extend laterally some distance beyond the first portion of the first semiconductor body. In this case, the first portion of the first semiconductor body traversed by the gate stack can function as a first capacitor conductor and the gate stack can comprise a dielectric layer that functions as a capacitor dielectric and a conductor layer that functions as a second capacitor conductor. Furthermore, the first length of the first portion can be predetermined in order to ensure that the non-planar capacitor has a predetermined capacitance value (i.e., a desired capacitance).

As mentioned above, the non-planar capacitors disclosed herein can include single-body single-gate non-planar capacitors as well as more complex non-planar capacitors, such as multi-body, single-gate or multi-gate finger, non-planar capacitors. It should be understood that the more complex non-planar capacitors (e.g., the multi-body, single-gate or multi-gate finger, non-planar capacitors, which are described in greater detail in the detailed description section of the specification below) can incorporate all same features as described above plus other features, including multiple semiconductor bodies and/or multiple gate fingers.

Also disclosed herein are methods of forming non-planar capacitors including, for example, single-body single-gate non-planar capacitors and also more complex non-planar capacitors, such as multi-body, single-gate or multi-gate finger, non-planar capacitors.

Specifically, a method of forming a single-body, single-gate, non-planar capacitor can comprise forming at least a first semiconductor body that is shorter in length than other semiconductor bodies, which are to be incorporated into either an adjacent device (e.g., an adjacent non-planar capacitor or an adjacent multi-gate field effect transistor (MUGFET)) or the same non-planar capacitor being formed.

Subsequently, a gate stack can be formed that traverses a first portion and, particularly, an end portion of this first semiconductor body. That is, the first semiconductor body, which is relatively short in length, can have a first top surface, first opposing sidewalls and first opposing endwalls. The gate stack can be formed such that the first portion of the first semiconductor body (i.e., the end portion of the first semiconductor body traversed by the gate stack) has a first length and the gate stack has a second length that is greater than the first length. Thus, the gate stack will be positioned adjacent to the first portion of the semiconductor body on the first top surface, on the first opposing sidewalls and on one of the first opposing endwalls and will further extend laterally some distance beyond the first portion of the first semiconductor body. In this case, the first portion of the first semiconductor body traversed by the gate stack can function as a first capacitor conductor and the gate stack can comprise a dielectric layer that functions as a capacitor dielectric and a conductor layer that functions as a second capacitor conductor. Furthermore, the processes used to form the first semiconductor body and the processes used to form the gate stack can be performed such that the first length of the first portion (i.e., the length of the end portion of the first semiconductor body traversed by the gate stack) is predetermined in order to ensure that the non-planar capacitor has a predetermined capacitance value (i.e., a desired capacitance).

As mentioned above, also disclosed herein are methods of forming more complex non-planar capacitors, such as multi-body, single-gate or multi-gate finger, non-planar capacitors. As described in greater detail in the detailed description section of the specification, the methods of forming these more complex non-planar capacitors (e.g., the multi-body, single-gate or multi-gate finger, non-planar capacitors) can comprise forming the same features (i.e., the first semiconductor body and gate stack), as described above, as well as forming other features, including multiple semiconductor bodies and/or multiple gate fingers.

It should be understood that various different processing can be used in forming such non-planar capacitors and particularly, in forming the at least one first semiconductor body that is shorter in length than other semiconductor bodies, which are to be incorporated into either an adjacent device (e.g., an adjacent non-planar capacitor or an adjacent multi-gate field effect transistor (MUGFET)) or the same non-planar capacitor being formed.

For example, in one particular embodiment, a mandrel can be formed on a semiconductor layer above an isolation layer. After the mandrel is formed, a sidewall spacer can be formed on vertical sidewalls of the mandrel such that the sidewall spacer laterally surrounds the mandrel. Then, the mandrel can be selectively removed and a first etch process can be performed using the sidewall spacer as a first mask in order to form a continuous semiconductor body having side sections and end sections.

A second mask can be formed on the continuous semiconductor body such that the second mask has at least one first opening exposing at least one region of one of the side sections and further has second openings exposing the end sections. Then, a second etch process can be performed in order to remove both the region(s) of the side section exposed in the first opening(s) and the end sections exposed in the second openings. Removal of the ends sections and region(s) of the side section will result in the formation of multiple discrete semiconductor bodies and, particularly, at least a first semiconductor body and a second semiconductor body, wherein the first semiconductor body is positioned laterally adjacent to and shorter in length than the second semiconductor body.

The method can further comprise forming a gate stack that traverses a first portion and, particularly, an end portion of the first semiconductor body. That is, the first semiconductor can have a first top surface, first opposing sidewalls and first opposing endwalls. The gate stack can be formed such that the first portion of the first semiconductor body (i.e., the end portion of the first semiconductor body traversed by the gate stack) has a first length and the gate stack has a second length that is greater than the first length. Thus, the gate stack will be positioned adjacent to the first portion of the first semiconductor body on the first top surface, on the first opposing sidewalls and on one of the first opposing endwalls and will further extend laterally some distance beyond the first portion of the first semiconductor body. The first portion of the first semiconductor body traversed by the gate stack can function as a first capacitor conductor and the gate stack can comprise a dielectric layer that functions as a capacitor dielectric and a conductor layer that functions as a second capacitor conductor. Furthermore, processes used to form the multiple semiconductor bodies and, particularly, the first semiconductor body as well as the processes used to form the gate stack can be performed such that the first length of the first portion (i.e., the length of the end portion of the first semiconductor body traversed by the gate stack) is predetermined in order to ensure that the non-planar capacitor has a predetermined capacitance value (i.e., a desired capacitance).

Optionally, the gate stack can further be formed so as to traverse the second semiconductor body and, thereby to form a multi-body single-gate non-planar capacitor. Also, optionally, the second mask can be formed and the second etch process can be performed so as to simultaneously form an additional semiconductor body that is positioned laterally adjacent to the second semiconductor body, that is relatively short as compared to the second semiconductor body and that is in end-to-end alignment with the first semiconductor body. In this case, during the process of forming the gate stack, an additional gate stack can be formed that is electrically connected to the gate stack and that traverses both the additional semiconductor body and the second semiconductor body, thereby forming a multi-body multi-gate finger non-planar capacitor.

BRIEF DESCRIPTION OF THE SEVERAL VIEWS OF THE DRAWINGS

The embodiments herein will be better understood from the following detailed description with reference to the drawings, which are not necessarily drawn to scale and in which:

FIG. 1A is a top view diagram of a non-planar capacitor;

FIG. 1B is a cross-section diagram of the non-planar capacitor of FIG. 1A;

FIG. 1C is another cross-section diagram of the non-planar capacitor of FIG. 1A;

DETAILED DESCRIPTION

Figure 2A:
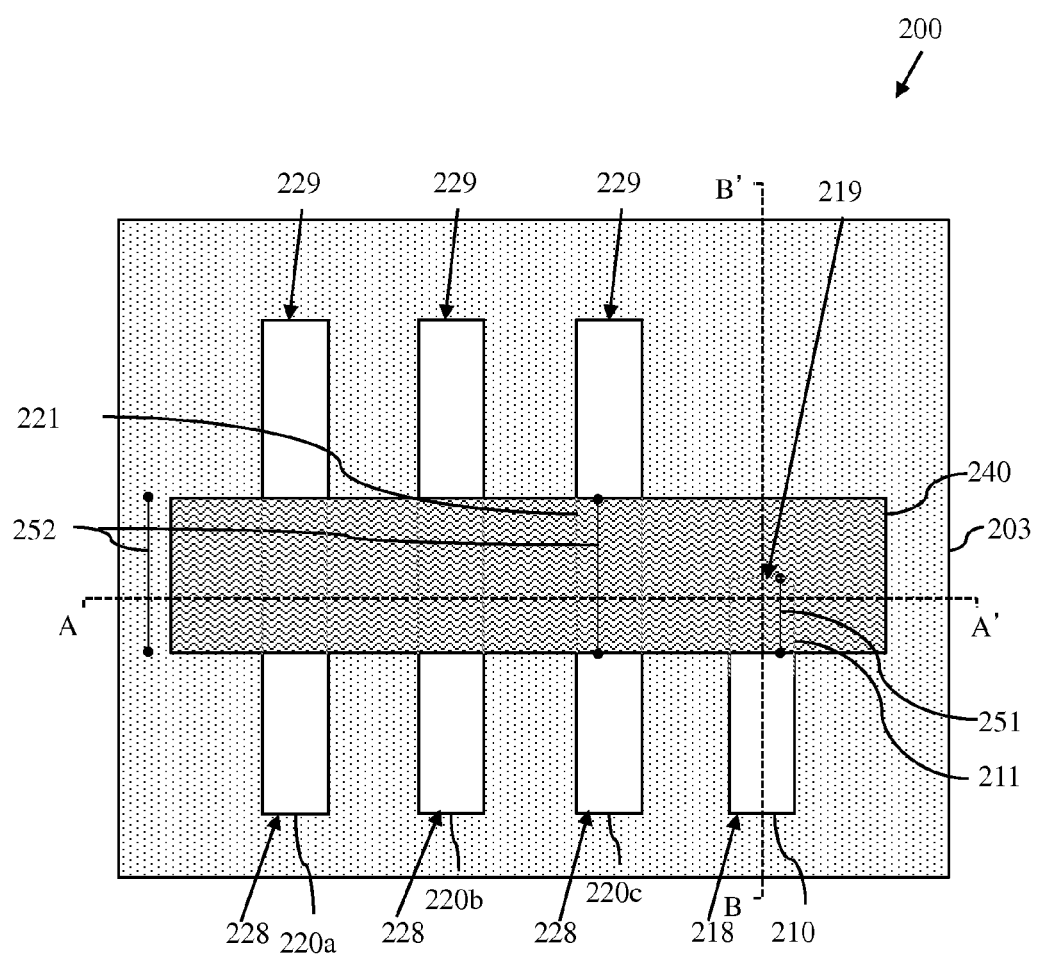
FIG. 2A is a top view diagram of yet another non-planar capacitor.

As mentioned above, integrated circuit design decisions are often driven by device scalability, device density, manufacturing efficiency and costs. For example, size scaling of planar field effect transistors (FETs) resulted in the development of planar FETs with relatively short channel lengths and, unfortunately, the smaller channel lengths resulted in a corresponding increase in short channel effects and a decrease in drive current.

In response, different types of multi-gate non-planar field effect transistor (MUGFET) technologies, such as fin-type FET (FINFET) technologies (also referred to herein as a dual-gate non-planar FET) and tri-gate non-planar FET technologies, have been developed. A FINFET is a non-planar FET comprising a relatively thin semiconductor body (typically referred to as a semiconductor fin) with a top surface and opposing sidewalls and with a channel region positioned laterally between source/drain regions. A gate stack is adjacent to the top surface and opposing sidewalls of the semiconductor body at the channel region. Since the semiconductor body of this FINFET is relatively thin, the FINFET essentially exhibits only two-dimensional field effects. That is, field effects are exhibited at the opposing sidewalls, but because the semiconductor body is so thin any field effects exhibited at the top surface are insignificant (i.e., negligible). A tri-gate non-planar FET is similar in structure to a FINFET. However, the semiconductor body of a tri-gate non-planar FET is relatively wide and, thus, the tri-gate non-planar FET exhibits three-dimensional field effects. Typically, multiple semiconductor bodies and/or multiple gate stacks will be incorporated into a given MUGFET structure in order to increase drive current as well as device density.

Additionally, since many integrated circuit designs require capacitors in addition to transistors, non-planar capacitors have also been developed along with methods of forming these non-planar capacitors. Generally, however, the processes used to form non-planar capacitors cannot readily be integrated into the processes used to form MUGFETs. Furthermore, the above-described MUGFET technologies are often design rule-dependent. That is, in a given MUGFET technology, the design rules require semiconductor bodies to be formed such that they are positioned laterally adjacent to each other (e.g., parallel to each other, substantially parallel to each other, slightly angled relative to each other so as to form a chevron pattern, etc.) and essentially identical in length, width, and height and such that the pitch is essentially uniform with the height being greater than ½ the pitch to ensure a relatively high current density as compared to a planar FET. Similarly, the design rules require gate stacks to be formed such that they traverse one or more of the semiconductor bodies and are essentially identical in length and height relative to the one or more semiconductor bodies) and such that the gate pitch is essentially uniform. Thus, even when the processes used to form non-planar capacitors are integrated into the processes used to form MUGFETS, the capacitance values of the resulting non-planar capacitors are quantized (i.e., fixed) due to the layout requirements. Therefore, there is a need in the art for a non-planar capacitor with a finely tuned (i.e., selectively adjusted) capacitance value and a method of forming the non-planar capacitor that can be readily integrated into the processes used in a design-rule dependent multi-gate non-planar field effect transistor (MUGFET) technology.

In view of the foregoing, disclosed herein are non-planar capacitors with finely tuned (i.e., selectively adjusted) capacitances and methods of forming these non-planar capacitors that can be readily integrated into the processes used in a design rule-dependent multi-gate non-planar field effect transistor (MUGFET) technology. The non-planar capacitors can each incorporate one or more semiconductor bodies and one or more gate stacks traversing the one or more semiconductor bodies. In such non-planar capacitors, any portion of a semiconductor body traversed by a gate stack functions as a first capacitor conductor and the gate stack comprises a dielectric layer that functions as capacitor dielectric and a conductor layer that functions as a second capacitor conductor. In the non-planar capacitors disclosed herein at least one first semiconductor body can be etched so that it is shorter in length than other semiconductor bodies, which are incorporated into other non-planar devices and/or into the same non-planar capacitor. Additionally, at least one gate stack can be formed so that it traverses a first portion and, particularly, an end portion of the shortened first semiconductor body and further so that it extends laterally some distance beyond that first portion. In such non-planar capacitors, the length of the first portion of the first semiconductor body, which corresponds to the first capacitor conductor and which is traversed by the gate stack, can be predetermined in order to achieve a desired capacitance.

More particularly, disclosed herein are non-planar capacitors including, for example, single-body single-gate non-planar capacitors as well as more complex non-planar capacitors, such as multi-body, single gate or multi-gate finger, non-planar capacitors.

Figure 2B:
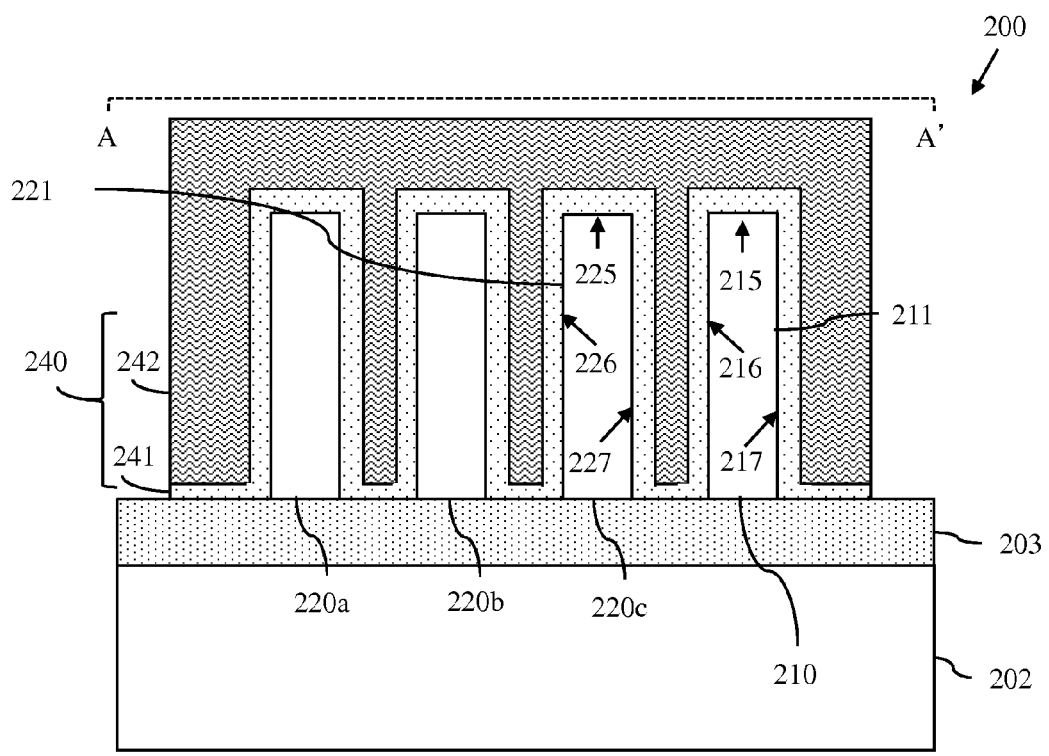
FIG. 2B is a cross-section diagram of the non-planar capacitor of FIG. 2A.
Figure 2C:
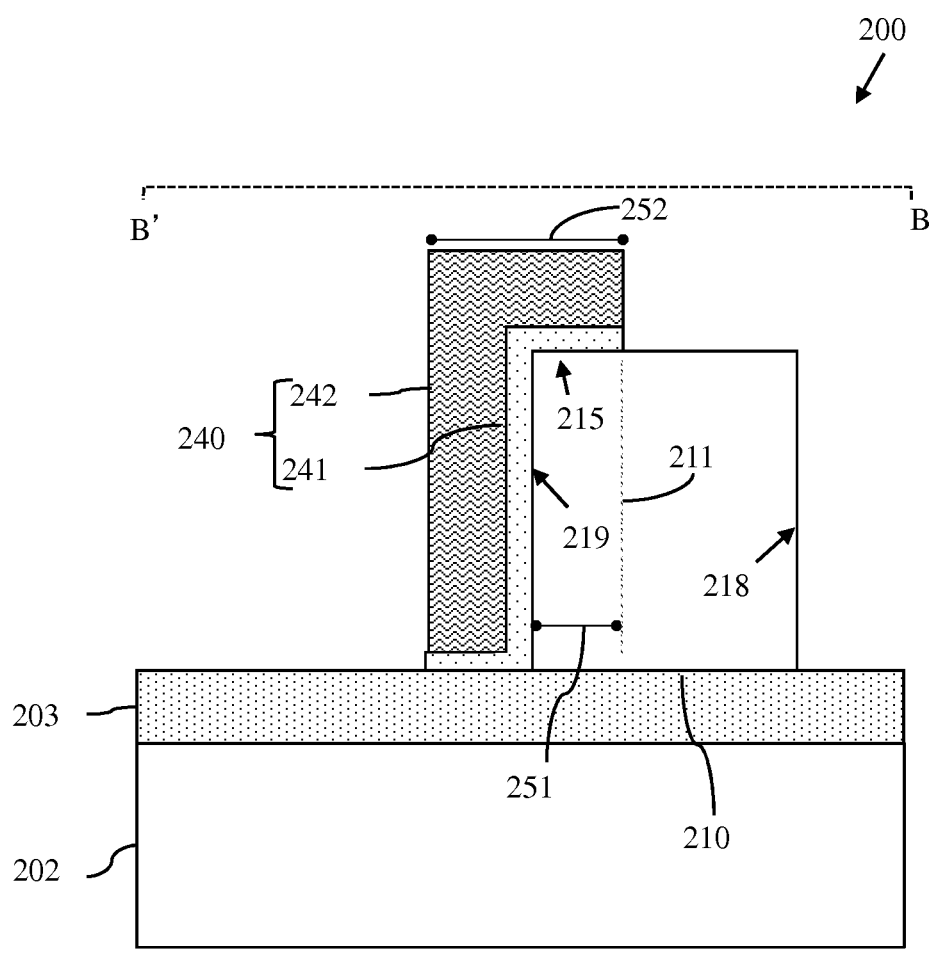
FIG. 2C is another cross-section diagram of the non-planar capacitor of FIG. 2A.
Figure 3A:
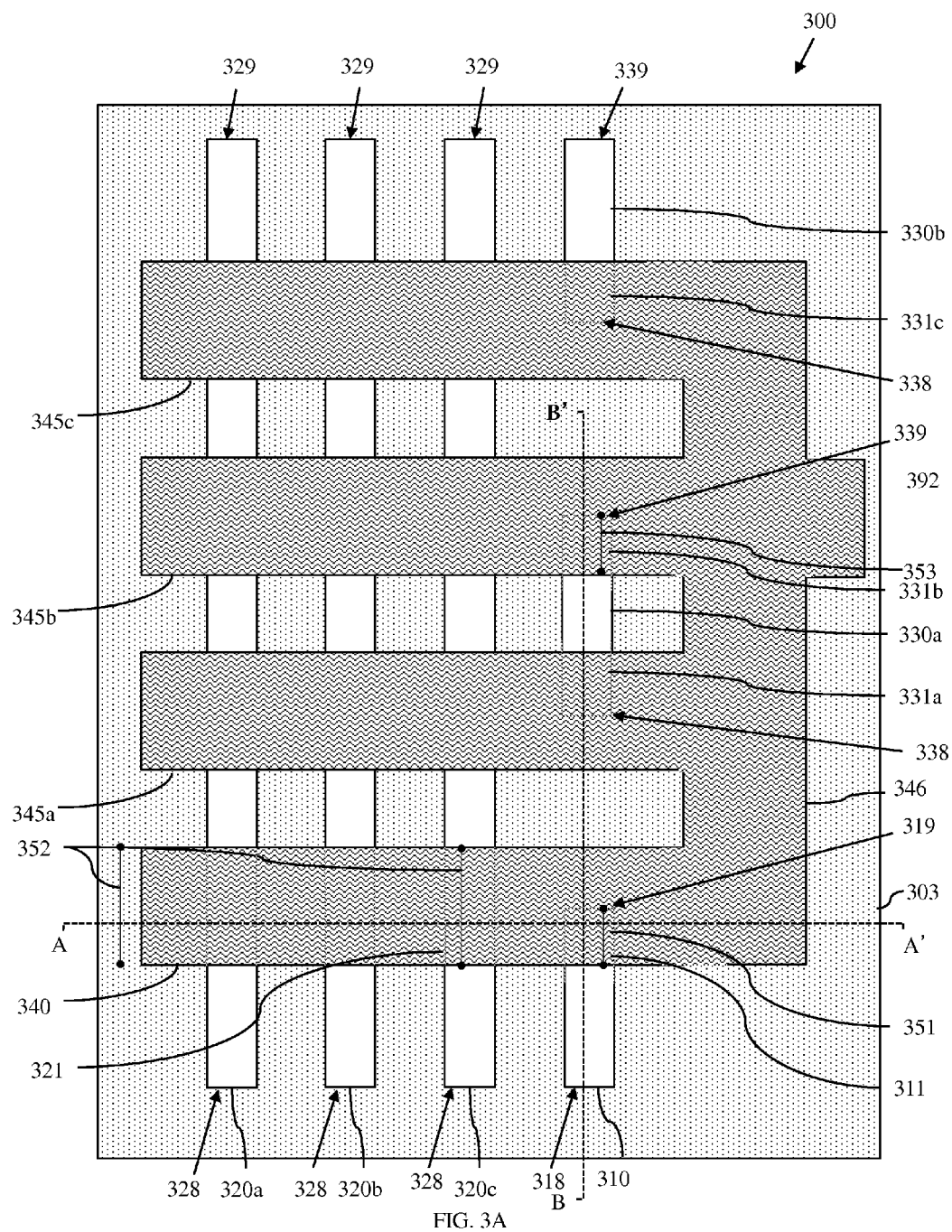
FIG. 3A is a top view diagram of yet another non-planar capacitor.
Figure 3B:
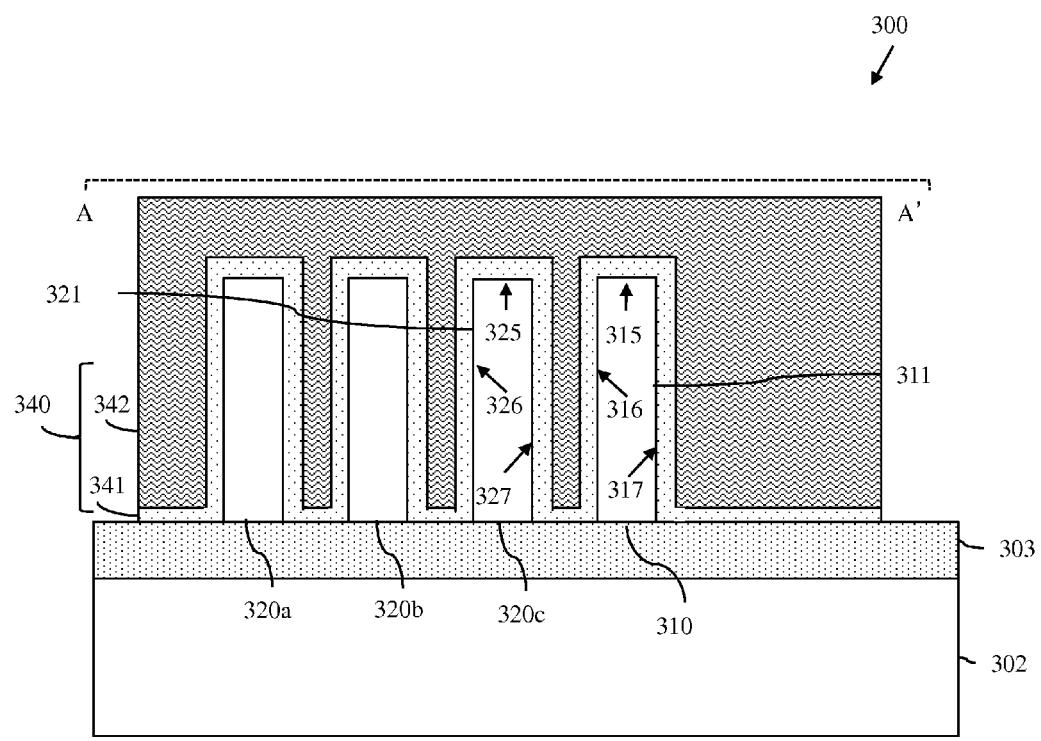
FIG. 3B is a cross-section diagram of the non-planar capacitor of FIG. 3A.
Figure 3C:
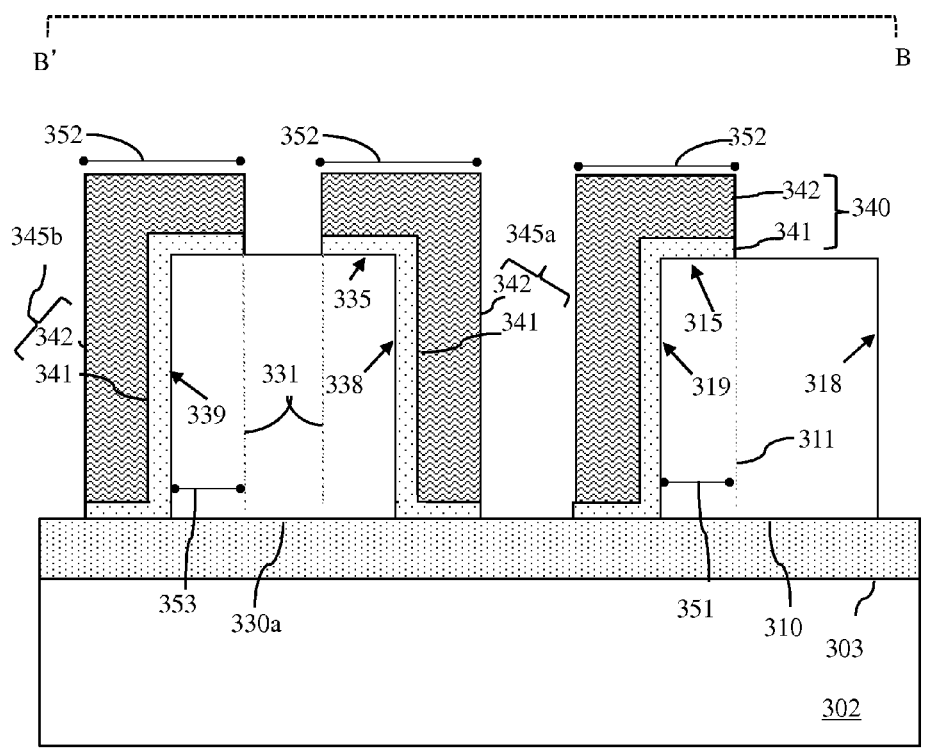
FIG. 3C is another cross-section diagram of the non-planar capacitor of FIG. 3A.

For example, the non-planar capacitor 100 of FIGS. 1A-1C is a single-body single-gate non-planar capacitor 100; the non-planar capacitor 200 of FIGS. 2A-2C is a multi-body single-gate non-planar capacitor 200; and the non-planar capacitor 300 of FIGS. 3A-3C is a multi-body multi-gate finger non-planar capacitor 300.

For purposes of this disclosure, a semiconductor body generally refers to a discrete semiconductor component on a substrate and having an essentially rectangular prism shape (as illustrated). However, it should be understood that, due to the processing techniques and/or the semiconductor material used to form the semiconductor body, the shape may vary slightly (e.g., the sidewalls of the semiconductor body may be angled or curved as opposed to perpendicular relative to the substrate such that the width of the semiconductor body tapers toward the top of the semiconductor body). In any case, a single-body non-planar capacitor refers to a non-planar capacitor comprising only a single semiconductor body. A multi-body non-planar capacitor refers to a non-planar capacitor that comprises multiple semiconductor bodies typically arranged such that they are positioned laterally adjacent to each other (e.g., parallel to each other, substantially parallel to each other, slightly angled relative to each other so as to form a chevron pattern, etc.). However, alternatively, they can be arranged in end-to-end alignment or otherwise arranged (as discussed in greater detail below). A single-gate non-planar capacitor refers to a non-planar capacitor that comprising a single-gate that traverses one semiconductor body or a single-gate that traverses multiple semiconductor bodies, depending upon whether the non-planar capacitor is a single-body or multi-body non-planar capacitor. A multi-gate finger non-planar capacitor refers to a non-planar capacitor wherein multiple, electrically connected, gate stacks traverse one semiconductor body or traverse multiple semiconductor bodies, depending upon whether the non-planar capacitor is a single-body or multi-body non-planar capacitor.

Each of the non-planar capacitors 100, 200, 300 disclosed herein can comprise one or more semiconductor bodies. For purposes of this disclosure, a semiconductor body is an essentially rectangular-shaped semiconductor body having a top surface and opposing sidewalls. As discussed above, when the semiconductor body is relatively thin (e.g., as in the case of a semiconductor body used in a fin-type field effect transistor (FINFET)), it is often referred to as a semiconductor fin. In any case, the one or more semiconductor bodies can comprise, for example, silicon, gallium nitride or any other suitable semiconductor material.

Optionally, the one or more semiconductor bodies can be positioned on an isolation layer or a buried isolation region. Specifically, each of the non-planar capacitors 100, 200, 300 can be formed on a semiconductor-on-insulator (SOI) wafer that comprises, for example, a semiconductor substrate 102, 202, 302 (e.g., a silicon substrate or any other suitable semiconductor substrate); an isolation layer 103, 203, 303 (e.g., a silicon dioxide (SiO$_2$) layer, a sapphire layer or any other suitable isolation layer) on the semiconductor substrate 102, 202, 302 and a semiconductor layer (e.g., a silicon layer, a gallium nitride layer, or any other suitable semiconductor layer) on the isolation layer 103, 203, 303. In this case, the one or more semiconductor bodies can be etched from the semiconductor layer. Alternatively, each of the non-planar capacitors 100, 200, 300 can be formed on a bulk semiconductor wafer (e.g., a bulk silicon wafer or any other suitable semiconductor wafer), wherein a lower portion 102, 202, 302 of the wafer is isolated from an upper portion by a buried isolation region 103, 203, 303 (e.g., a buried well region). In this case, the one or more semiconductor bodies can be etched from the upper portion of the bulk semiconductor wafer. Formation of the one or more semiconductor bodies above an isolation layer or isolation region allows for grounding or biasing. Alternatively, each of the non-planar capacitors 100, 200, 300 can be formed on a bulk semiconductor wafer (e.g., a bulk silicon wafer or any other suitable semiconductor wafer) without the above-described buried isolation region. In this case, the one or more semiconductor bodies can be etched from the upper portion of the bulk semiconductor wafer and floated (i.e., not biased or connected to ground).

Additionally, the one or more semiconductor bodies of the non-planar capacitors 100, 200, 300 can comprise at least a first semiconductor body 110, 210, 310 and, optionally, one or second and/or additional semiconductor bodies (as discussed in detail below). For example, the single-body, single-gate, non-planar capacitor 100 of FIGS. 1A-1C can comprise a first semiconductor body 110 (e.g., above the isolation layer/region 103). The multi-body, single-gate, non-planar capacitor 200 of FIGS. 2A-2C can comprise (e.g., above the isolation layer/region 203) a first semiconductor body 210 and one or more second semiconductor bodies 220a-c, which is/are positioned laterally adjacent to the first semiconductor body 210 and longer than the first semiconductor body 210. For example, the second semiconductor body or bodies can be parallel to the first semiconductor body (as illustrated), substantially parallel to the first semiconductor body (not shown) or slightly angled relative to the first semiconductor body (not shown). For purposes of illustration three second semiconductor bodies 220a-c are shown in FIG. 2A; however, it should be understood that any number of one or more semiconductor bodies could alternatively be used. The multi-body, multi-gate finger, non-planar capacitor 300 of FIGS. 3A-3C can comprise (e.g., above the isolation layer/region 303) a first semiconductor body 310, one or more second semiconductor bodies 320a-c, which is/are positioned laterally adjacent to (e.g., parallel to (as illustrated), substantially parallel to, slightly angled relative to, etc.) the first semiconductor body 310 and longer than the first semiconductor body 210, and one or more additional semiconductor bodies 330a-b, which is/are positioned laterally adjacent to (e.g., parallel to (as illustrated), substantially parallel to, slightly angled relative to, etc.) the second semiconductor bodies 320a-c, shorter than the one or more second semiconductor bodies 320a-c and in end-to-end alignment with the first semiconductor body 310. For purposes of illustration three second semiconductor bodies 220a-c and two additional semiconductor bodies 330a-b are shown in FIG. 3A; however, it should be understood that any number of one or more semiconductor bodies and one or more additional semiconductor bodies could alternatively be used.

Each semiconductor body in each of the non-planar capacitors 100, 200, 300 (e.g., the first semiconductor body 110 of the non-planar capacitor 100; the first semiconductor body 210 and the one or more second semiconductor bodies 220a-c of the non-planar capacitor 200; and the first semiconductor body 310, the one or more second semiconductor bodies 320a-c and the one or more additional semiconductor bodies 330a-b of the non-planar capacitor 300) can have N-type or P-type conductivity. That is, each semiconductor body can be doped with a N-type or P-type dopant so as to have the same conductivity type (e.g., N-type or P-type) across its length, width and height. Optionally, each semiconductor body can have essentially uniform N-type or P-type conductivity. That is, each semiconductor body can be essentially uniformly doped with a N-type or P-type dopant so as to have essentially uniform conductivity in terms of both type and level across its length, width and height. Alternatively, each semiconductor body can have essentially uniform conductivity in terms of type, but can have one or more regions (e.g., a contact region) with a relatively high conductivity level as compared to other regions of the semiconductor body. Those skilled in the art will recognize that different dopants can be used to achieve the desired conductivity types and that the dopants may vary depending upon the different semiconductor materials used. For example, a silicon-based semiconductor material having N-type conductivity is typically doped with a N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having N-type conductivity is typically doped with silicon (Si).

Optionally, as illustrated, each semiconductor body in each of the non-planar capacitors 100, 200, 300 (e.g., the first semiconductor body 110 of the non-planar capacitor 100; the first semiconductor body 210 and the one or more second semiconductor bodies 220a-c of the non-planar capacitor 200; and the first semiconductor body 310, the one or more second semiconductor bodies 320a-c and the one or more additional semiconductor bodies 330a-b of the non-planar capacitor 300) can have essentially the same width and the same height. Also, optionally, as illustrated, the semiconductor body pitch (i.e., the distance between a specific point, such as the center or side, of one semiconductor body to the same specific point on an adjacent semiconductor body) can be essentially uniform from semiconductor body to semiconductor body. Alternatively, these specifications (i.e., the semiconductor body width, height, and/or pitch) may vary from device to device and/or within a single non-planar capacitor. In any case, these specifications (i.e., the semiconductor body width, height and pitch) can be set by the design rules for the particular multi-gate non-planar field effect transistor (MUGFET) technology within which the processes used to form the non-planar capacitors 100, 200, 300 are integrated. Alternatively, such specifications can be different than those set by the design rules for the particular multi-gate non-planar field effect transistor (MUGFET) technology.

Additionally, the first semiconductor body 110, 210, 310 in each of the non-planar capacitors 100, 200, 300 can be shorter in length than other semiconductor bodies that are, for example, on the same isolation layer 103, 203, 303 and that are incorporated into either an adjacent device (e.g., an adjacent non-planar capacitor or an adjacent multi-gate field effect transistor (MUGFET) (not shown)) or the same non-planar capacitor. For example, although not shown, the semiconductor body 110 of the non-planar capacitor 100 of FIG. 1 can be shorter in length than other semiconductor bodies incorporated into an adjacent device (e.g., into an adjacent non-planar capacitor or an adjacent MUGFET), as discussed in greater detail below with regard to the method. Alternatively, as shown in the non-planar capacitor 200 of FIGS. 2A-2C and the non-planar capacitor 300 of FIGS. 3A-3C), the first semiconductor body 210, 310 can be relatively short in length as compared to the one or more second semiconductor bodies 220a-c, 320a-c, which are incorporated into the same non-planar capacitor 200, 300, as discussed in greater detail below with regard to the method.

Each of the non-planar capacitors 100, 200, 300 can further comprise a gate stack 140, 240, 340 that traverses a first portion 111, 211, 311 and, particularly, an end portion of the first semiconductor body 110, 210, 310. Specifically, the first semiconductor body 110, 210, 310, which is relatively short in length, can have a first top surface 115, 215, 315, first opposing sidewalls 116-117, 216-217, 316-317 and first opposing endwalls 118-119, 218-219, 318-319. The first portion 111, 211, 311 (i.e., the end portion) of the first semiconductor body 110, 210, 310 can be traversed by the gate stack 140, 240, 340 such that the gate stack 140, 240, 340 is positioned adjacent to that first portion 111, 211, 311 on the first top surface 115, 215, 315, on the first opposing sidewalls 116-117, 216-217, 316-317 and on one of the first opposing endwalls (e.g., first opposing endwall 119, 219, 319). The first portion 111, 211, 311 of the first semiconductor body 110, 210, which is traversed by the gate stack 140, 240, 340, can have a first length 151, 251, 351 and the gate stack 140, 240, 340 can have a second length 152, 252, 352, which is greater than the first length 151, 251, 351 (as measured in a direction parallel to the first semiconductor body 110, 210, 310) such that the first opposing endwall 119, 219, 319 of the first semiconductor body 110, 210, 310 is below the first top surface of the gate stack 140, 240, 340 and such that the gate stack 140, 240, 340 extends laterally some distance beyond the first portion 111, 211, 311 and, particularly, beyond the first opposing endwall 119, 219, 319. The second length 152, 252, 352 (i.e., the gate length) can be a fixed length. This second length 152, 252, 352 can be set, for example, by the design rules for the particular multi-gate non-planar field effect transistor (MUGFET) technology within which the processes used to form the non-planar capacitor 100, 200, 300 are integrated. Alternatively, this second length 152, 252, 352 can be different than that set by the design rules for the particular multi-gate non-planar field effect transistor (MUGFET) technology. The first length 151, 251, 351 can be predetermined, as discussed in greater detail below, to achieve a desired capacitance.

The gate stack 140, 240, 340 can comprise at least one dielectric layer 141, 241, 341 and at least one conductor layer 142, 242, 342. The dielectric layer 141, 241, 341 can be a conformal dielectric layer adjacent to the first portion 111, 211, 311 of the first semiconductor body 110, 210, 310 on the first top surface 115, 215, 315, on the first opposing sidewalls 116-117, 216-217, 316-317 and on the one first opposing endwall 119, 219, 319. This dielectric layer 141, 241, 341 can comprise, for example, a silicon dioxide layer, a silicon nitride layer, a silicon oxynitride layer, a high-K dielectric layer, such as a hafnium (Hf)-based dielectric layer (e.g., hafnium oxide, hafnium silicon oxide, hafnium silicon oxynitride, hafnium aluminum oxide, etc.) or some other suitable high-K dielectric layer (e.g., aluminum oxide, tantalum oxide, zirconium oxide, etc.), or any other dielectric layer suitable for use as a dielectric plate for a capacitor. The conductor layer 142, 242, 342 can be on the dielectric layer 141, 241, 341 and can comprise, for example, a doped polysilicon conductor layer, a metal conductor layer and/or any other conductor layer suitable for use as a conductive plate for a capacitor. Although the gate stack 140, 240, 340 is illustrated as comprising only a single dielectric layer and a single conductor layer, the figures are not intended to be limiting and it should be understood that more than one dielectric layer and/or more than one conductor layer could, alternatively, be used.

In any case, the different gate conductor materials may vary depending upon the conductivity type of the semiconductor body 110, 210, 310. For example, when the semiconductor body 110, 210, 310 has a N-type conductivity, the conductor layer 142, 242, 342 can comprise an N-doped polysilicon layer and/or a stack of one or more metals and/or a metal alloys including, but not limited to, at least one metal conductor (e.g., hafnium, zirconium, titanium, tantalum, aluminum, and alloys thereof, such as, hafnium carbide, zirconium carbide, titanium carbide, tantalum carbide, and aluminum carbide) having, for example, a similar work function as an N-doped polysilicon layer. When the semiconductor body 110, 210, 310 has a P-type conductivity, the conductor layer 142, 242, 342 can comprise a P-doped polysilicon layer and/or a stack of one or more metals and/or metal alloys including, but not limited to, at least one metal gate conductor (e.g., ruthenium, palladium, platinum, cobalt, and nickel or a metal oxide, such as aluminum carbon oxide, aluminum titanium carbon oxide, etc. or a metal nitride, such as titanium nitride, titanium silicon nitride, tantalum silicon nitride, titanium aluminum nitride, tantalum aluminum nitride, etc.) having, for example, a similar work function as a P-doped polysilicon layer.

With this configuration, the first portion 111, 211, 311 of the first semiconductor body 110, 210, 310 traversed by the gate stack 140, 240, 340 can function as a first capacitor conductor. The dielectric layer 141, 241, 341 of the gate stack 140, 240, 340 can function as a capacitor dielectric and the conductive layer 142, 242, 342 of the gate stack 140, 240, 340 can each function as a second capacitor conductor opposite the first capacitor conductor. It should be noted that the first length 151, 251, 351 of the first portion 111, 211, 311 of the first semiconductor body 110, 210, 310 (i.e., the length of the end portion of the semiconductor body 110, 210, 310 that is traversed by the gate stack 140, 240, 340) and, thereby the length of the first conductive plate in any of the non-planar capacitors 100, 200, 300 can be a specific length that is, as mentioned above, shorter than the second length 152, 252, 352 of the gate stack 140, 240, 340. This first length 151, 252, 351 can be predetermined in order to ensure that the non-planar capacitor 100, 200, 300 has a predetermined capacitance value (i.e., a desired capacitance). That is, this first length 151, 252, 351 can be predetermined in order to finely tune the capacitance of the non-planar capacitor 100, 200, 300.

As mentioned above, the non-planar capacitors disclosed herein can include a single-body, single-gate, non-planar capacitor 100, as illustrated in FIGS. 1A-1C, as well as more complex non-planar capacitors 200, 300 (e.g., multi-body, single-gate or multi-gate finger non-planar capacitors), as illustrated in FIGS. 2A-2C and 3A-3C, respectively. Specifically, the non-planar capacitors 200, 300 are each multi-body non-planar capacitors that comprise one or more second semiconductor bodies 220a-c, 320a-c, which is/are optionally above the isolation layer/region 203, 303, which is/are positioned laterally adjacent to (e.g., parallel to (as illustrated), substantially parallel to, slightly angled relative to, etc.) the first semiconductor body 210, 310 and which is/are longer than the first semiconductor body 210, 310. In these multi-body non-planar capacitors 200, 300, the gate stack 240, 340 can further traverse a second portion 221, 321 of each second semiconductor body 220a-c, 320a-c, thereby increasing the capacitance value. That is, each second semiconductor body 220a-c, 320a-c, which is/are relatively long in length as compared to the first semiconductor body 210, 310, can each have a second top surface 225, 325, second opposing sidewalls 226-227, 326-327 and second opposing endwalls 228-219, 328-329. A second portion 221, 321 of each second semiconductor body 220a-c, 320a-c, which is aligned with the first portion 211, 311 (i.e., the end portion) of the first semiconductor body 210, 310, can be traversed by the gate stack 240, 340 such that the gate stack 240, 340 is positioned adjacent to that second portion 221, 321 on the second top surface 225, 325 and on the second opposing sidewalls 226-227, 326-327. As illustrated, the gate stack 240, 340 can further be positioned laterally between the second opposing endwalls 228-229, 328-329. Thus, the second portion 221, 321 of each second semiconductor body 220a-c, 320a-c (i.e., the portion of each second semiconductor body 220a-c, 320a-c traversed by the gate stack 240, 340) can have the same length as the gate stack 240, 340 (i.e., can have the second length 252, 352).

As mentioned above, for purposes of illustration, three second semiconductor bodies 220a-c, 320a-c are shown in FIGS. 2A-2B and FIGS. 3A-3B. However, it should be understood that the figures are not intended to be limiting and that these multi-body non-planar capacitors could, alternatively, comprise any number of one or more second semiconductor bodies.

The non-planar capacitor 300 of FIGS. 3A-3C is also a multi-gate finger non-planar capacitor. Specifically, the non-planar capacitor 300 can further comprise one or more additional semiconductor bodies 330a-b, which is/are, for example, above an isolation layer/region 303, which is/are positioned laterally adjacent to (e.g., parallel to (as illustrated), substantially parallel to, slightly angled relative to, etc.) the one or more second semiconductor bodies 320a-c, which is/are relatively short in length as compared to the one or more second semiconductor bodies 320a-c, and which is/are in end-to-end alignment with the first semiconductor body 310.

This non-planar capacitor 300 can also further comprise one or more additional gate stacks 345a-c, each traversing one or more additional semiconductor bodies (e.g., 330a and/or 330b) and, optionally, the one or more second semiconductor bodies 320a-c. The additional gate stack(s) 345a-c can, for example, have the same length as the gate stack 340 (i.e., can have the second length 352, as measured in a direction parallel to the one or more additional semiconductor bodies 330a-b). Optionally, the gate pitch (i.e., the distance between a specific point, such as the center or side, of one gate stack to the same specific point on an adjacent gate stack) can be essentially uniform from gate stack to gate stack, as shown. The second length 352 (i.e., the gate length) as well as the gate pitch can, for example, be set by the design rules for the particular multi-gate non-planar field effect transistor (MUG-FET) technology within which the processes used to form the non-planar capacitor 300 are integrated. Alternatively, these specifications (i.e., the gate length and gate pitch) can be different than that set by the design rules for the particular multi-gate non-planar field effect transistor (MUGFET) technology.

It should further be noted that the gate stack 340 and the additional gate stack(s) 345a-c could comprise the same dielectric and conductor layers 341-342. Additionally, the gate stack 340 and additional gate stack(s) 345a-c can be electrically connected, for example, by a gate connector 346 that is perpendicular to and immediately adjacent to ends of the gate stack 340 and additional gate stack(s) 345a-c and that comprises the same dielectric and conductor layers 341-342 as the gate stack 340 (as shown). Alternatively, this gate connector 346 can comprise a conductive strap that traverses and is immediately adjacent to the top surfaces of the gate stack 340 and additional gate stack(s) 345a-c (not shown).

In any case, each additional gate stack 345a-c can traverse an additional portion 331a-c of an additional semiconductor body 330a-b and, optionally, can traverse the one or more second semiconductor bodies 320a-c, thereby increasing the capacitance value of the non-planar capacitor 300. Specifically, each additional semiconductor body 330a-b, which is positioned laterally adjacent to the one or more second semiconductor bodies 320a-c, which is relatively short in length as compared to the one or more second semiconductor bodies 320a-c and which is in end-to-end alignment with the semiconductor body 310, can have an additional top surface 335, additional opposing sidewalls 336-337 and additional opposing endwalls 338-339. At least one additional portion of each additional semiconductor body can be traversed by an additional gate stack such that the additional gate stack is positioned adjacent to that additional portion on the additional top surface 335, on the additional opposing sidewalls 336-337 and either on one of the additional opposing endwalls (e.g., endwall 339, as shown) or, alternatively, positioned laterally between the additional opposing endwalls 338-339 (not shown). For example, additional gate stack 345a can traverse the additional portion 331a of the additional semiconductor body 330a at its endwall 338. The additional gate stack 345b can traverse the additional portion 331b of the same additional semiconductor body 330a at its opposing endwall 339. The additional gate stack 345c can traverse the additional portion 331c of the additional semiconductor body 330b at its endwall 338. Thus, each additional portion 331a-c of the additional semiconductor body 330a-b (i.e., the portion of each additional semiconductor body 330a-b traversed by an additional gate stack) will have an additional length 353 that is either shorter than the second length of the gate stack (i.e., the additional length 353 is shorter than the second length 352, as shown) or, alternatively, the same length as the length of the gate stack (i.e., the additional length 353 is the same as the second length 352 (not shown)). Consequently, in the non-planar capacitor 300, the first length 351 of the first portion 311 of the first semiconductor body 310 traversed by the gate stack 340 and any additional length 353 of any additional portion 331a-c of any additional semiconductor body 330a-b traversed by any additional gate stack (e.g., 345a-c) can be predetermined in order to ensure that the non-planar capacitor 300 has a predetermined capacitance value (i.e., a desired capacitance). That is, the first length 351 and any additional length 353 can be predetermined in order to finely tune the capacitance of the non-planar capacitor 300.

For purposes of illustration, two additional semiconductor bodies 330a-b and three additional gate stacks 345a-c are shown in FIGS. 3A-3B. However, it should be understood that the figures are not intended to be limiting and that this multi-fi multi-gate finger capacitor could, alternatively, comprise any number of one or more additional semiconductor bodies and any number of one or more additional gate stacks.

In addition to the features described, the non-planar capacitors 100 of FIGS. 1A-1C, 200 of FIGS. 2A-2C, and 300 of FIGS. 3A-3C can further comprise contacts to the each semiconductor body and, thereby to first conductive plates contained therein, as well as contacts to the gate stack (or gate stacks, as applicable) and, thereby to second conductive plates contained therein. Furthermore, in the multi-body non-planar capacitors 200 of FIGS. 2A-2C and 300 of FIGS. 3A-3C, the exposed portions of the semiconductor bodies on opposing sides of the gate stack (or gate stacks, as applicable) can, optionally, be merged (e.g., by an epitaxial semiconductor layer (not shown)) or electrically connected (e.g., by a conductive strap (not shown)), as specified, for example, by the design rules for the particular multi-gate non-planar field effect transistor (MUGFET) technology within which the processes used to form the non-planar capacitors 100, 200, 300 are integrated. Thus, the epitaxial semiconductor layer or conductive strap, as applicable, can be contacted as opposed to contacting each individual semiconductor body.

Figure 4:
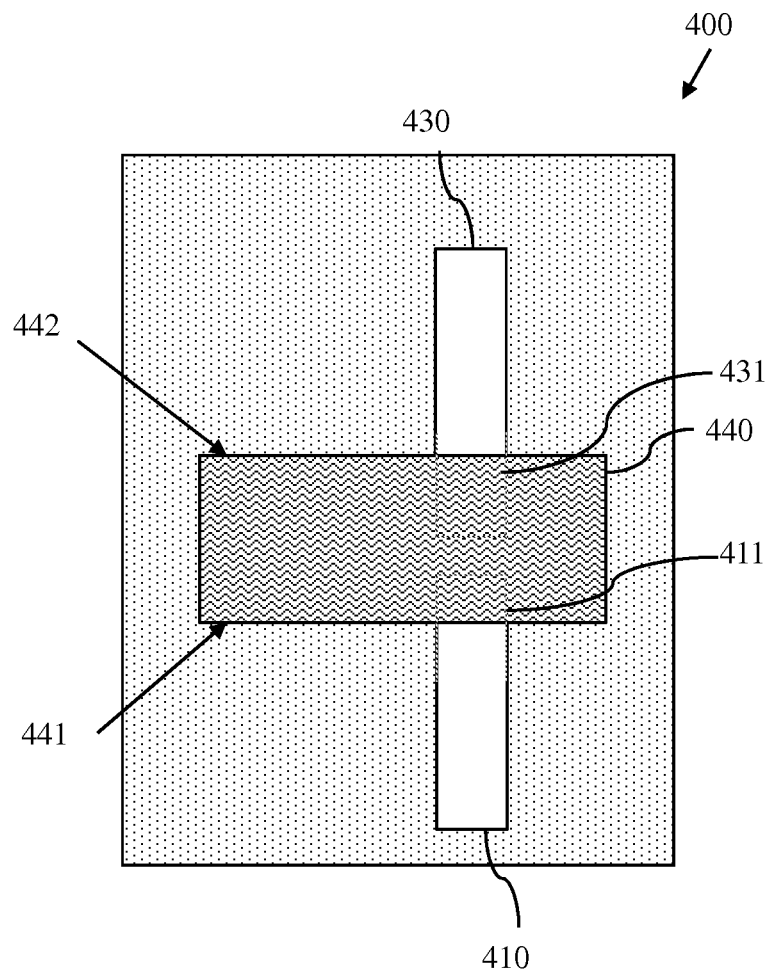
FIG. 4 is a top view diagram of yet another non-planar capacitor.
Figure 5:
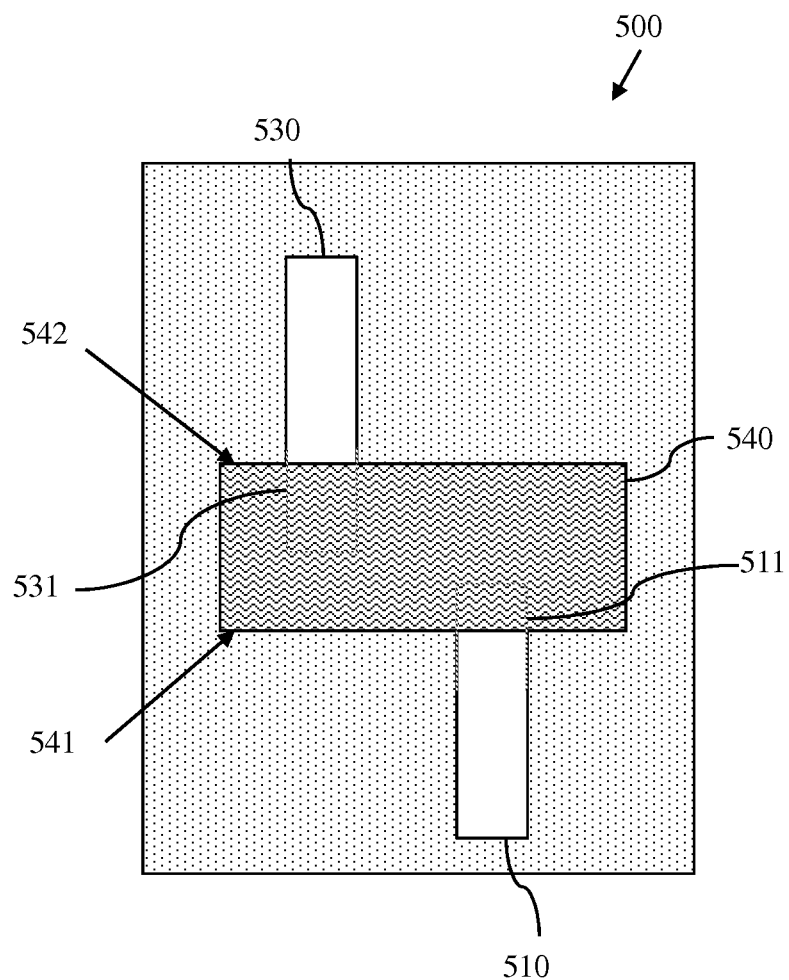
FIG. 5 is a top view diagram of yet another non-planar capacitor.

The descriptions of the various structural embodiments of the present invention have been presented above for purposes of illustration, but are not intended to be exhaustive or limited to the embodiments disclosed. Many modifications and variations will be apparent to those of ordinary skill in the art without departing from the scope and spirit of the described embodiments. For example, as illustrated in FIG. 4, in yet another non-planar capacitor 400, a first portion 411 and, particularly, an end portion of a first semiconductor body 410 can be traversed by a first side 441 of a gate stack 440. A second side 442 of this same gate stack 440 can traverse an additional portion 431 and, particularly, an adjacent end portion of an additional semiconductor body 430 in end-to-end alignment with the first semiconductor body 410. The lengths of the first portion 411 of the first semiconductor body 410 and of the additional portion 431 of the additional semiconductor body 430, which are traversed by the gate stack 440, can be either the same or different (as shown). Similarly, as illustrated in FIG. 5, in yet another non-planar capacitor 500, a first portion 511 and, particularly, an end portion of a first semiconductor body 510 can be traversed by a first side 541 of a gate stack 540. A second side 542 of this same gate stack 540 can traverse an additional portion 531 of an additional semiconductor body 530, which is offset from the first semiconductor body 510. The lengths of the first portion 511 of the first semiconductor body 510 and of the additional portion 531 of the additional semiconductor body 530, which are traversed by the gate stack 540, can be either the same or different (as shown). Similar features to those shown in FIGS. 4 and 5 and mentioned above could also be incorporated into multi-gate finger non-planar capacitors.

Also disclosed herein are methods of forming non-planar capacitors including, for example, a single-body single-gate non-planar capacitor 100, as illustrated in FIGS. 1A-1C and described in detail above, and also more complex non-planar capacitors, such as the multi-body single-gate non-planar capacitor 200, as illustrated in FIGS. 2A-2C and described in detail above, and the multi-body multi-gate finger non-planar capacitor 300, as illustrated in FIGS. 3A-3C and described in detail above.

Figure 6:
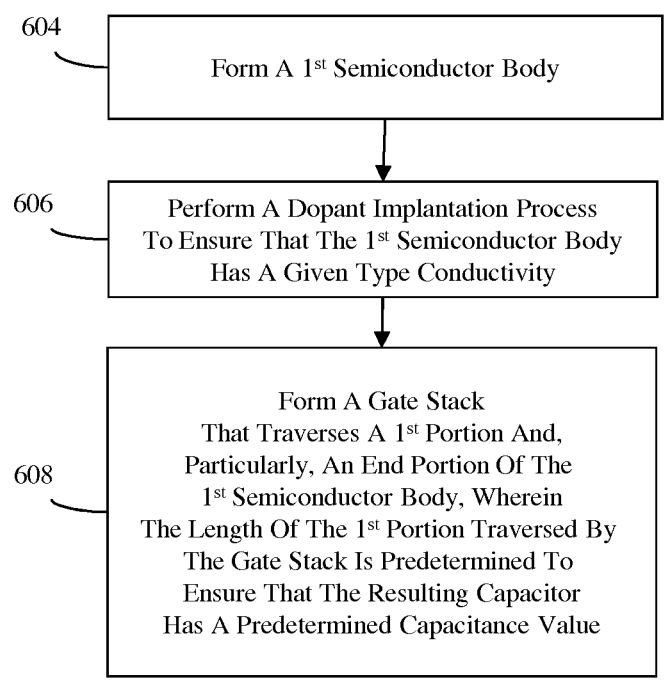
FIG. 6 is a flow diagram illustrating a method of forming a non-planar capacitor such as the non-planar capacitor of FIGS. 1A-1C.

Referring to FIG. 6, disclosed herein is a method of forming a non-planar capacitor, such as a single-body single-gate non-planar capacitor 100, as illustrated in FIGS. 1A-1C. In this method, a first semiconductor body 110 can be formed (604).

Figure 7:
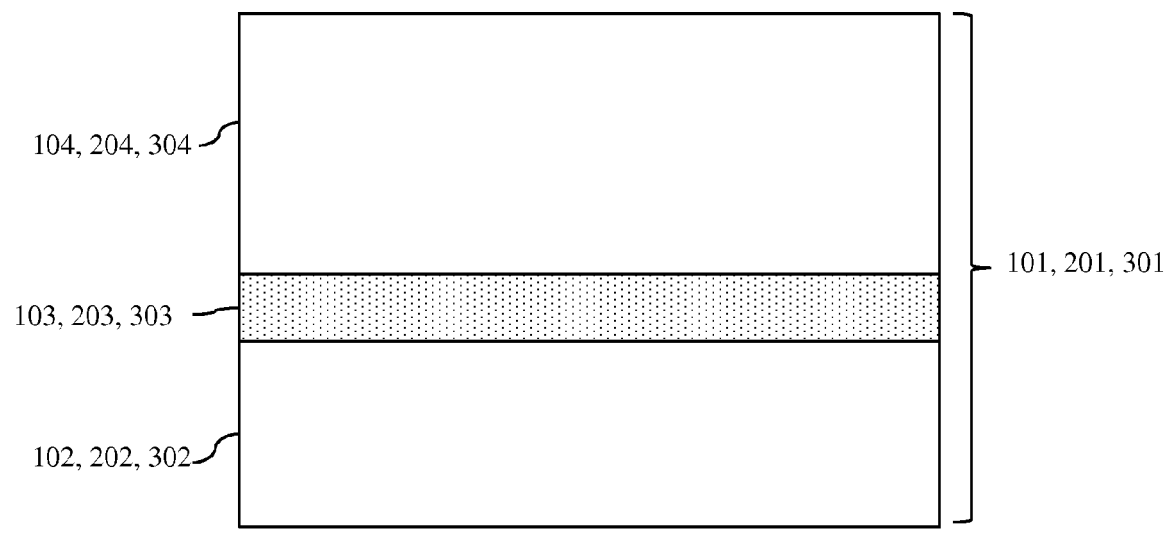
FIG. 7 is a cross-section diagram illustrating an exemplary semiconductor wafer for use in forming the non-planar capacitors disclosed herein.

Specifically, as illustrated in FIG. 7, the method can comprise providing a semiconductor-on-insulator (SOI) wafer 101 that comprises, for example, a semiconductor substrate 102 (e.g., a silicon substrate or any other suitable semiconductor substrate); an isolation layer 103 (e.g., a silicon dioxide ($SiO_2$) layer, a sapphire layer or any other suitable isolation layer layer) on the semiconductor substrate 102 and a semiconductor layer 104 (e.g., a silicon layer, a gallium nitride layer, or any other suitable semiconductor layer) on the isolation layer 103. Alternatively, the method can comprise providing a bulk semiconductor wafer 101 (e.g., a bulk silicon wafer or any other suitable semiconductor wafer), wherein a lower portion 102 of the wafer is isolated from an upper portion 104 of the wafer by a buried isolation region 103 (e.g., a buried well region). Alternatively, the method can comprise providing a bulk semiconductor wafer (e.g., a bulk silicon wafer or any other suitable semiconductor wafer) and without the above described buried isolation region (not shown).

Figure 8A:
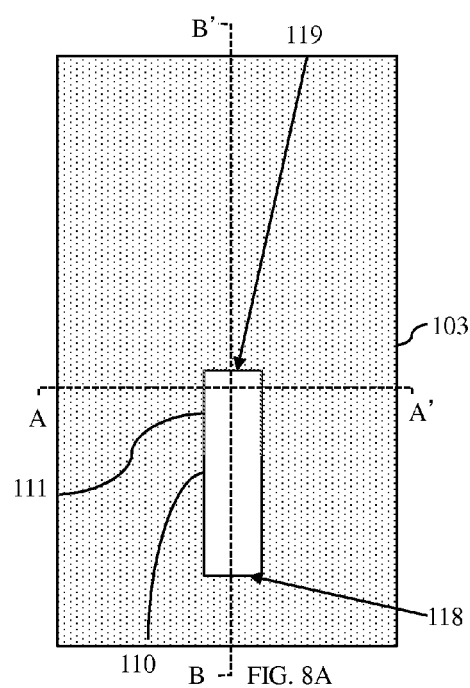
FIG. 8A is a top view diagram of a partially completed non-planar capacitor formed according to the method of FIG. 6.
Figure 8B:
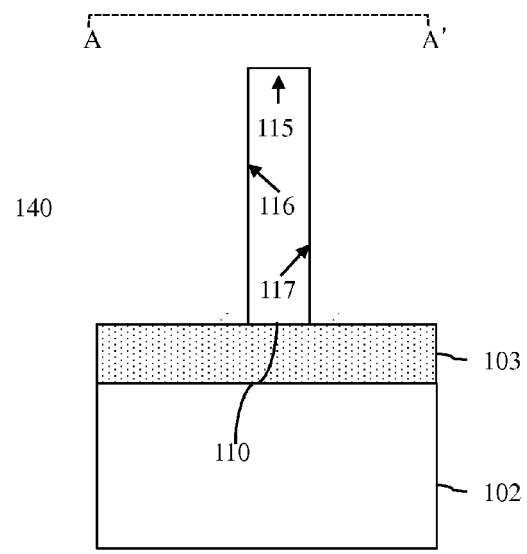
FIG. 8B is a cross-section diagram of the partially completed non-planar capacitor of FIG. 8A.
Figure 8C:
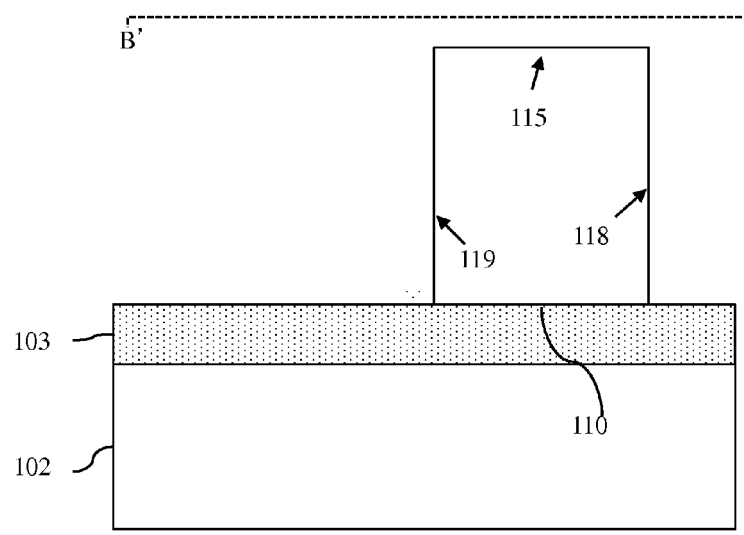
FIG. 8C is another cross-section diagram of the partially completed non-planar capacitor of FIG. 8A.

The method can further comprise forming, at process 604, a first semiconductor body 110 from the semiconductor layer 104 (or from the upper portion 104 of the bulk semiconductor wafer, if applicable), using a conventional semiconductor body (e.g., semiconductor fin) formation technique. For example, the first semiconductor body 110 can be formed using a lithographic patterning and etch technique, a sidewall image transfer (SIT) technique or any other suitable semiconductor body formation technique. Such techniques are well known in the art and, thus, the details are omitted from the specification in order to allow the reader to focus on the salient aspects of the disclosed method. In any case, as illustrated in FIGS. 8A-8C, the first semiconductor body 110 can have a first top surface 115, first opposing sidewalls 116-117 and first opposing endwalls 118-119. Optionally, the first semiconductor body 110 can be formed such that it is shorter in length than other semiconductor bodies, which are formed on the same wafer and which are to be incorporated into some other adjacent device (e.g., an adjacent non-planar capacitor or an adjacent MUGFET). It should be noted that, when the first semiconductor body 110 is formed above an isolation layer 103 (or above an isolation region of a bulk semiconductor wafer, if applicable), the semiconductor body 110 could be connected to ground or biased. However, when the first semiconductor body 110 is formed using a bulk semiconductor substrate without a buried isolation region, the first semiconductor body 110 will be floated (i.e., will not biased or connected to ground).

In any case, either before or after the first semiconductor body 110 is formed at process 604, at least one dopant implantation process can be performed in order to ensure that the first semiconductor body 110 has the same type conductivity (e.g., N-type conductivity or P-type conductivity) across its length, width and height (606). This dopant implantation process can be performed such that the first semiconductor body 110 has essentially uniform N-type or P-type conductivity. That is, this dopant implantation process can be performed such that the first semiconductor body is essentially uniformly doped with a N-type or P-type dopant so as to have essentially uniform conductivity in terms of both type and level across its length, width and height. Alternatively, the dopant implantation process can be performed such that the first semiconductor body 110 has essentially uniform conductivity in terms of type, but also has one or more regions (e.g., a contact region) with a relatively high conductivity level as compared to other regions of the semiconductor body.

The method can further comprise forming a gate stack 140 that traverses a first portion 111 and, particularly, an end portion of the first semiconductor body 110 (608, see FIGS. 1A-1C). One exemplary technique for forming such a gate stack 140 can comprise forming (e.g., depositing) at least one conformal dielectric layer 141 over the first semiconductor body 110 and forming (e.g., depositing) at least one blanket conductor layer 142 over the dielectric layer 141. The dielectric and conductor layers 141-142 can subsequently be lithographically patterned and etched so as to form the gate stack 140 that traverses the first portion 111 of the first semiconductor body 110 (i.e., the end portion of the first semiconductor body) and, particularly, that is positioned adjacent to that first portion 111 on the first top surface 115, on the first opposing sidewalls 116-117 and on one of the first opposing endwalls (e.g., first opposing endwall 119, as shown in FIGS. 1A and 1C). It should be noted that the exemplary technique for forming a gate stack 140, as described above, is offered for illustration purposes. Various different techniques for forming a gate stack on a semiconductor body are well known in the art and any of these techniques could, alternatively, be incorporated into the disclosed method. Furthermore, although the gate stack 140 is illustrated as being formed with only a single dielectric layer and a single conductor layer, the figures are not intended to be limiting and it should be understood that more than one dielectric layer and/or more than one conductor layer could, alternatively, be used.

In any case, with this configuration, the first portion 111 of the first semiconductor body 110 traversed by the gate stack 140 can function as a first capacitor conductor. The dielectric layer 141 of the gate stack 140 can function as a capacitor dielectric and the conductive layer 142 of the gate stack 140 can function as a second capacitor conductor opposite the first capacitor conductor. Furthermore, the processes 604 and 608 used to form the first semiconductor body 110 and the gate stack 140, respectively, can be performed such that the first portion 111 has a first length 151 and the gate stack 140 has a second length 152 that is greater than the first length 151, as measured in a direction parallel to the semiconductor body 110. The second length 152 of the gate stack 140 can, for example, be a fixed length. This second length 152 can, for example, be set by the design rules for the particular multi-gate non-planar field effect transistor (MUGFET) technology within which the processes used to form the non-planar capacitor 100 are integrated. Alternatively, this second length 152 can be different than the gate length set by the design rules for the particular multi-gate non-planar field effect transistor (MUGFET) technology. Due to the different first and second lengths, the endwall 119 of the semiconductor body 110 will be below the top surface of the gate stack 140 and the gate stack 140 will extend laterally some distance beyond the first portion 111 and, particularly, beyond the endwall 119 of the first semiconductor body 110. The processes 604 and 608 used to form the first semiconductor body 110 and the gate stack 140, respectively, should further be performed such that the first length 151 of the first portion 111 of the first semiconductor body 110 (i.e., the length of the end portion of the semiconductor body 110 that is to be traversed by the gate stack 140) and, thereby the length of the first capacitor conductor in the non-planar capacitor 100 is a specific length, which is predetermined in order to ensure that the non-planar capacitor 100 has a predetermined capacitance value (i.e., a desired capacitance). That is, this first length 151 of the end portion 111 of the first semiconductor body 110 adjacent to the gate stack 140 can be selectively adjusted (i.e., controlled during processing) in order to finely tune the capacitance of the non-planar capacitor 100.

As mentioned above, also disclosed herein are methods of forming more complex non-planar capacitors, such as multi-body, single-gate or multi-gate finger, non-planar capacitors. The methods of forming these more complex non-planar capacitors (e.g., the multi-body, single-gate or multi-gate finger, non-planar capacitors) can comprise forming the same features (i.e., the first semiconductor body and gate stack), as described above, as well as forming other features, including multiple semiconductor bodies and/or multiple gate stacks.

Figure 9:
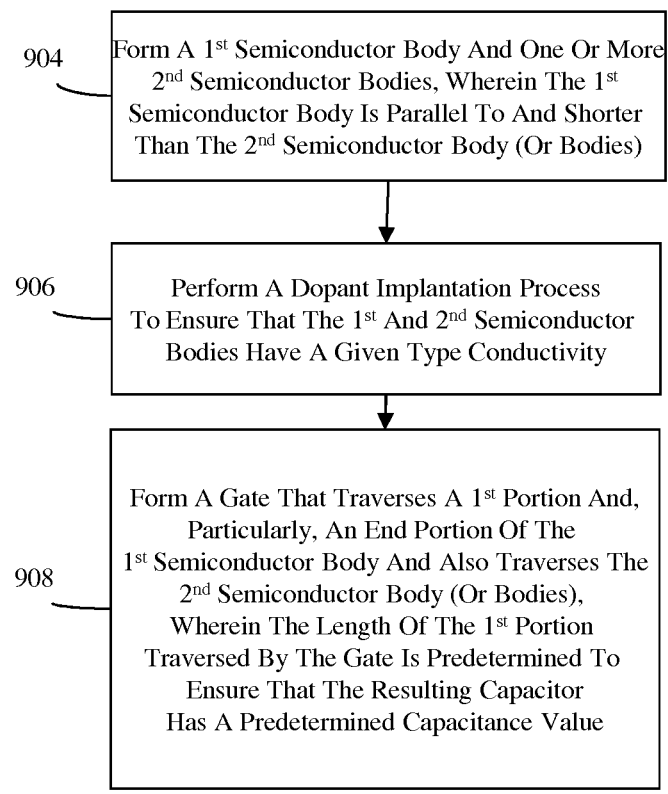
FIG. 9 is a flow diagram illustrating a method of forming a non-planar capacitor such as the non-planar capacitor of FIGS. 2A-2C.

For example, FIG. 9 is a flow diagram illustrating a method of forming another non-planar capacitor, such as a multi-body single-gate non-planar capacitor 200, as illustrated in FIGS. 2A-2C.

In this method, multiple semiconductor bodies, including a first semiconductor body 210 and one or more second semiconductor bodies 220*a*-*c* can be formed (904).

Specifically, as illustrated in FIG. 7, the method can comprise providing a semiconductor-on-insulator (SOI) wafer 201 that comprises, for example, a semiconductor substrate 202 (e.g., a silicon substrate or any other suitable semiconductor substrate); an isolation layer 203 (e.g., a silicon dioxide (SiO$_2$) layer, a sapphire layer or any other suitable isolation layer layer) on the semiconductor substrate 202 and a semiconductor layer 204 (e.g., a silicon layer, a gallium nitride layer, or any other suitable semiconductor layer) on the isolation layer 203. Alternatively, the method can comprise providing a bulk semiconductor wafer 201 (e.g., a bulk silicon wafer or any other suitable semiconductor wafer), wherein a lower portion 202 of the wafer is isolated from an upper portion 204 of the wafer by a buried isolation region 203 (e.g., a buried well region). Alternatively, the method can comprise providing a bulk semiconductor wafer (e.g., a bulk silicon wafer or any other suitable semiconductor wafer) and without the above described buried isolation region (not shown). It should be noted that, when the semiconductor bodies 210 and 220*a*-*c* are formed above an isolation layer 203 (or above an isolation region of a bulk semiconductor wafer, if applicable), they could be connected to ground or biased. However, when the semiconductor bodies 210 and 220*a*-*c* are formed using a bulk semiconductor substrate without a buried isolation region, they will be floated (i.e., will not biased or connected to ground).

The method can further comprise forming, at process 904, a first semiconductor body 210 and one or more second semiconductor bodies 220*a*-*c* from the semiconductor layer 204 (or from the upper portion 204 of the bulk semiconductor wafer, if applicable). The first semiconductor body 210 and the one or more second semiconductor bodies 220*a*-*c* can specifically be formed so that the first semiconductor body 210 has a first top surface 215, first opposing sidewalls 216-217 and first opposing endwalls 218-219, so that the one or more second semiconductor bodies 220*a*-*c* have a second top surface 225, second opposing sidewalls 226-227 and second opposing endwalls 228-229 and so that the first semiconductor body 210 is shorter in length than the one or more second semiconductor bodies 220*a*-*c*.

The first semiconductor body 210 and the one or more second semiconductor bodies 220*a*-*c* can be formed, for example, using a conventional semiconductor body formation technique (e.g., a lithographic patterning and etch technique, a sidewall image transfer (SIT) technique or any other suitable semiconductor body formation technique). Optionally, these techniques can be performed so that the resulting first and second semiconductor bodies 210 and 220*a*-*c* have the same width, the same height and a uniform pitch (e.g., as set by the design rules for the particular multi-gate non-planar field effect transistor (MUGFET) technology within which the processes used to form the non-planar capacitor 200 are integrated). Alternatively, these techniques can be performed so that the semiconductor body specifications (i.e., the semiconductor body width, height and/or pitch) are different than those set by the design rules for the particular multi-gate non-planar field effect transistor (MUGFET) technology. In any case, one or more additional process steps can be incorporated into the conventional semiconductor body formation technique in order to shorten the first semiconductor body 210 relative to the one or more second semiconductor bodies 220*a*-*c*.

Figure 10:
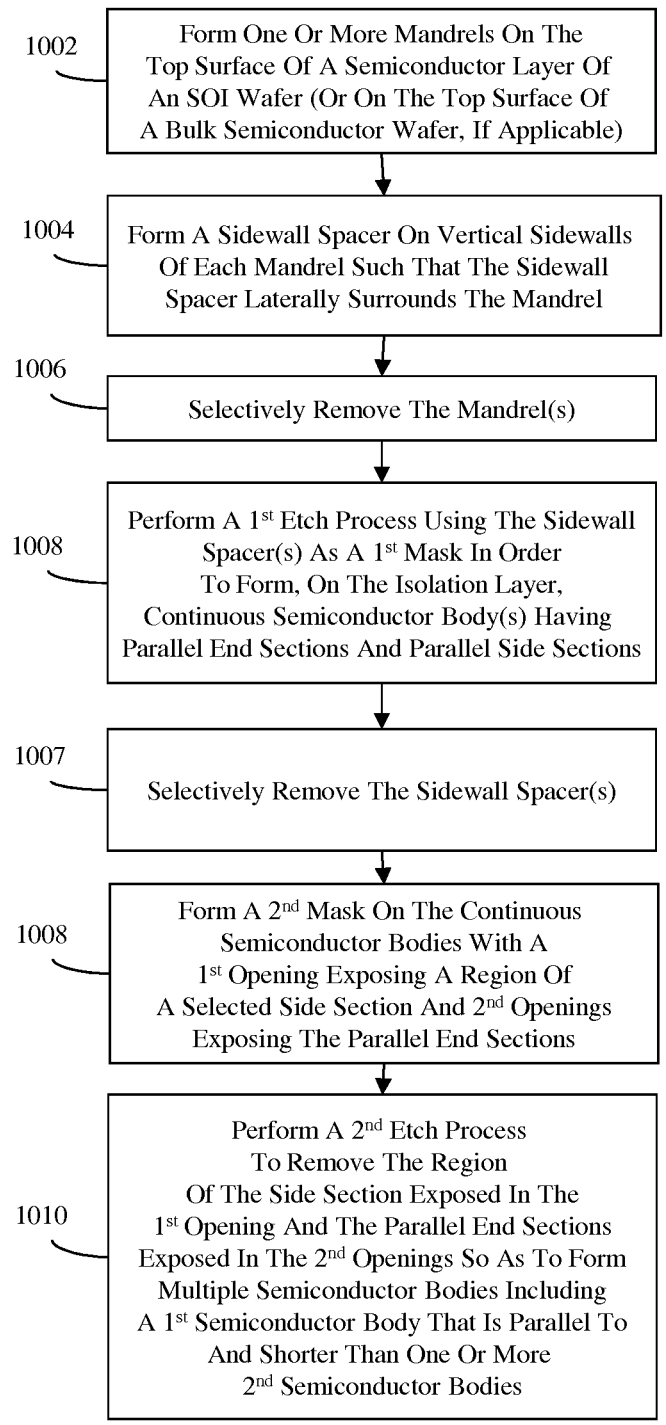
FIG. 10 is a flow diagram illustrating in greater detail process 904 of the flow diagram of FIG. 9.
Figure 11:
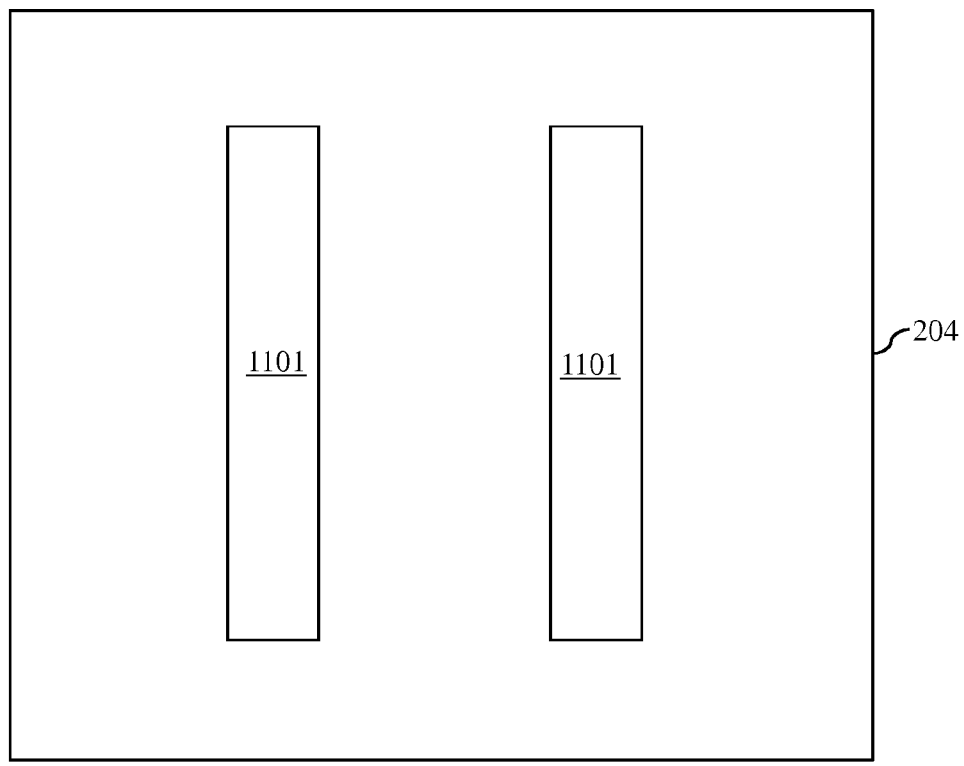
FIG. 11 is a top view diagram of a partially completed non-planar capacitor formed according to the method of FIGS. 9-10.

FIG. 10 is a flow diagram illustrating one exemplary technique that can be used to form the first semiconductor body 210 and the one or more second semiconductor bodies 220*a*-*c* at process 904. Specifically, at least one mandrel 1101 can be formed on the top surface of the semiconductor layer 204 (1002, see FIG. 11). For purposes of this disclosure a mandrel comprises a sacrificial body that can be formed and subsequently selectively removed (see more detailed discussion below). The mandrel can, for example, be a rectangular prism in shape (as illustrated). Alternatively, the shape of the mandrel can be that of a different three-dimensional parallelogram, a three-dimensional trapezoid or any other suitable three-dimensional shape. It should be noted that two mandrels are shown for illustration purposes; however, it should be understood that any number of one or more mandrels 901 could, alternatively, be formed.

Figure 12:
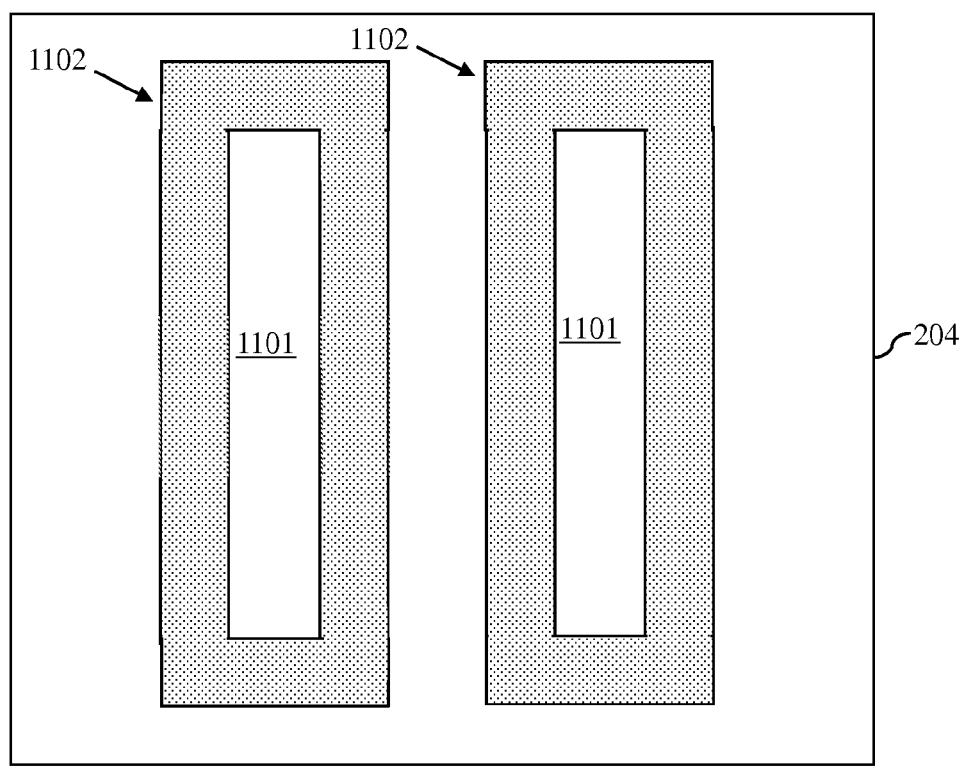
FIG. 12 is a top view diagram of a partially completed non-planar capacitor formed according to the method of FIGS. 9-10.

A sidewall spacer 1102 can subsequently be formed on vertical sidewalls of each mandrel 1101 so as to laterally surround that mandrel (1004, see FIG. 12). For example, a spacer material layer can be conformally deposited over the mandrel(s) 1101 and an anisotropic etch process can be performed so as to remove the spacer material layer from horizontal surfaces of the semiconductor layer 204 (or bulk semiconductor wafer, if applicable) and mandrel(s) 1101 and so as to leave the spacer material on the vertical surfaces of the mandrel(s) 1101 intact.

After the sidewall spacer(s) 1102 are formed, the mandrel(s) 1101 can be selectively removed (1006). It should be noted that the spacer material layer and, thereby the sidewall spacer(s) 1102 can comprise, for example, a dielectric material (e.g., silicon oxide, silicon nitride, silicon oxynitride, etc.) and the mandrel(s) 1101 can comprise, for example, either a different dielectric material or polysilicon such that the mandrel(s) 1101 can be selectively etched over the sidewall spacer(s) 1102 and the semiconductor layer 204.

Figure 13:
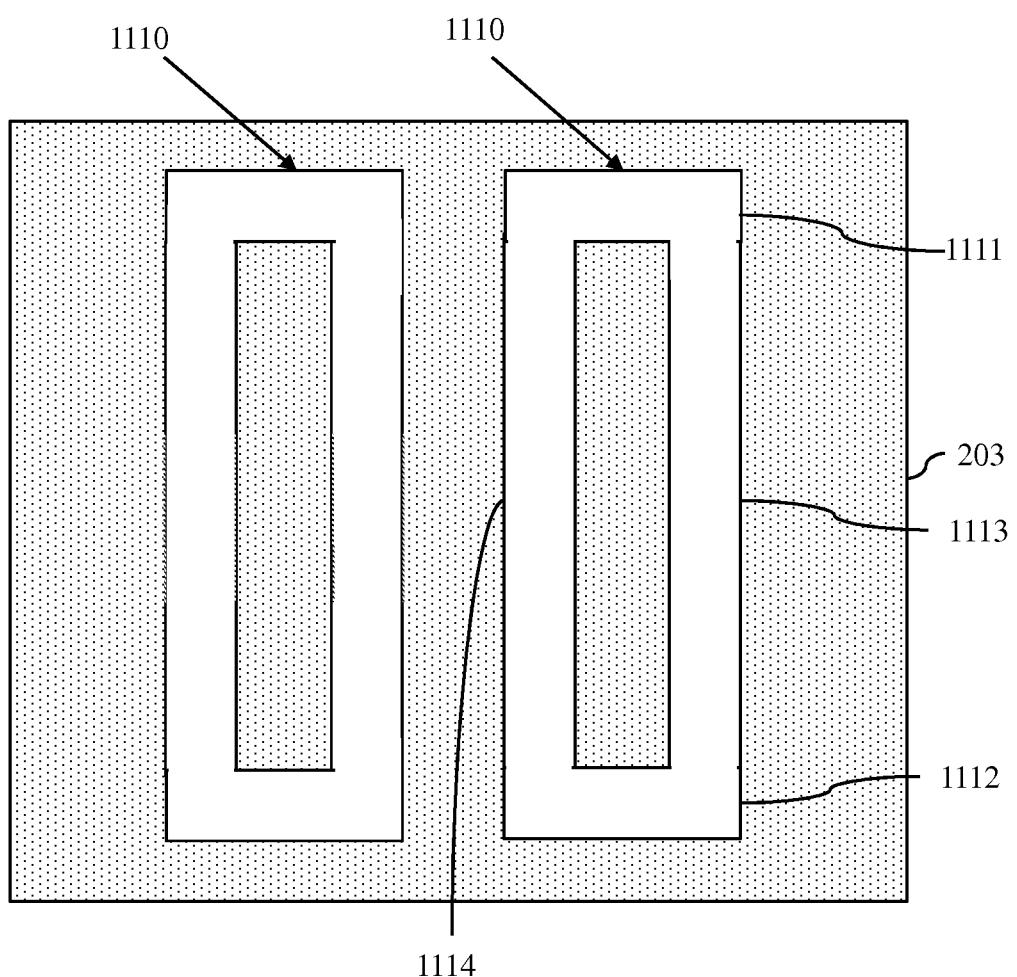
FIG. 13 is a top view diagram of a partially completed non-planar capacitor formed according to the method of FIGS. 9-10.

Next, a first etch process (e.g., an anisotropic etch process) can be performed using the sidewall spacer(s) 1102 as a first mask in order to form, from the semiconductor layer 204 above the isolation layer 203 (or from the upper portion 204 of the bulk semiconductor wafer, if applicable), continuous semiconductor body(s) 1110, each having side sections 1113-1114 and end sections 1111-1112 (1008, see FIG. 13). Once the continuous semiconductor body(s) 1110 are formed, the sidewall spacer(s) 1102 can be selectively removed (1007).

Figure 14:
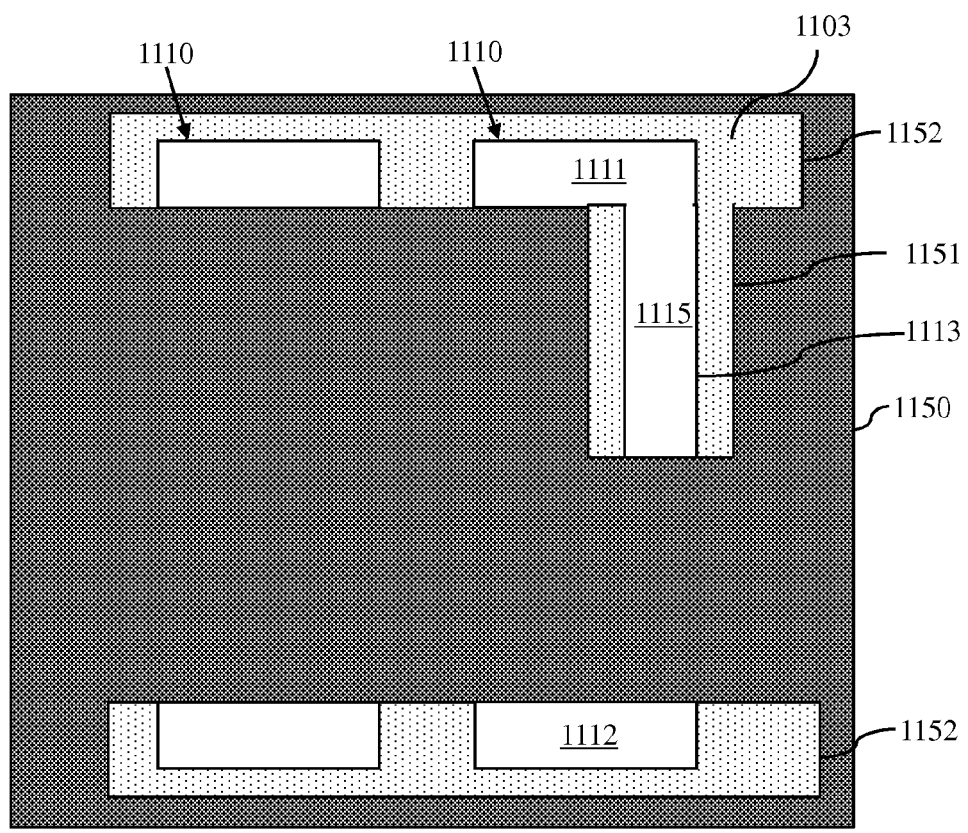
FIG. 14 is a top view diagram of a partially completed non-planar capacitor formed according to the method of FIGS. 9-10.
Figure 15A:
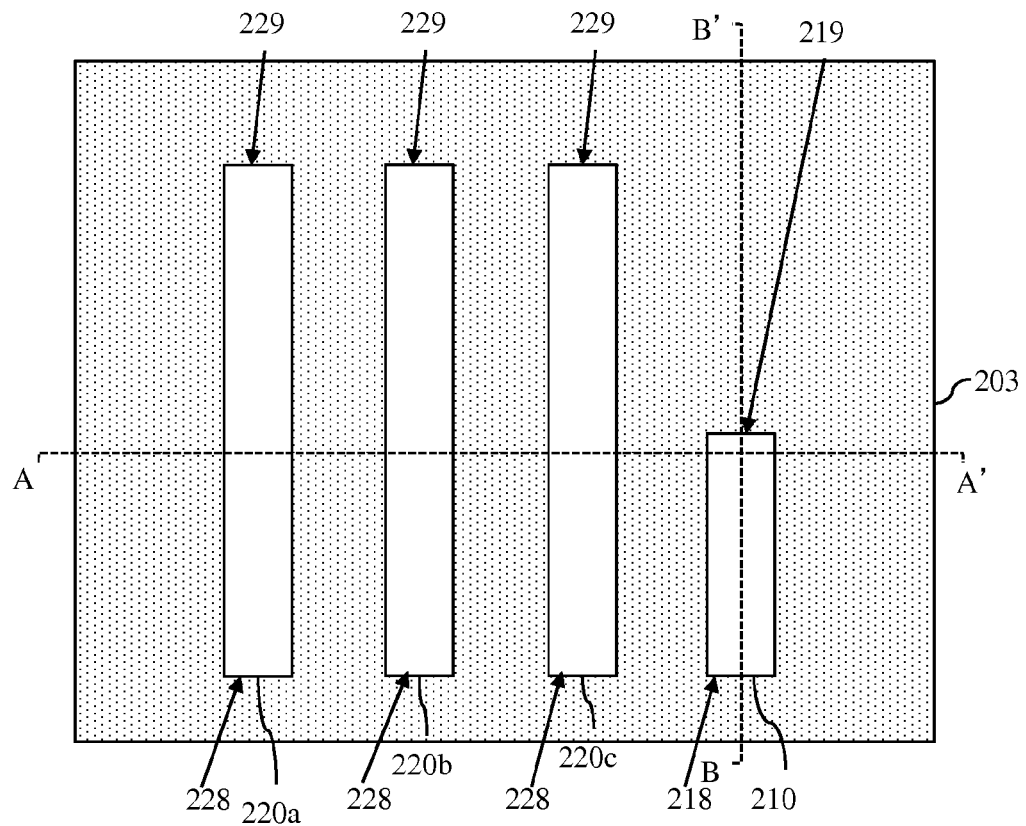
FIG. 15A is a top view diagram of a partially completed non-planar capacitor formed according to the method of FIGS. 9-10.
Figure 15B:
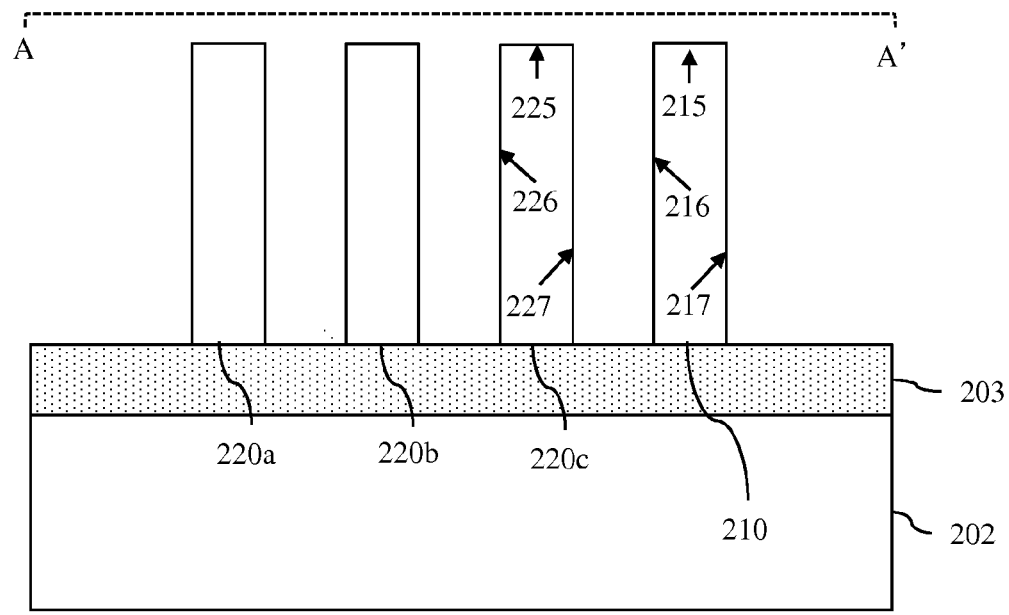
FIG. 15B is a cross-section diagram of the partially completed non-planar capacitor of FIG. 15A.
Figure 15C:
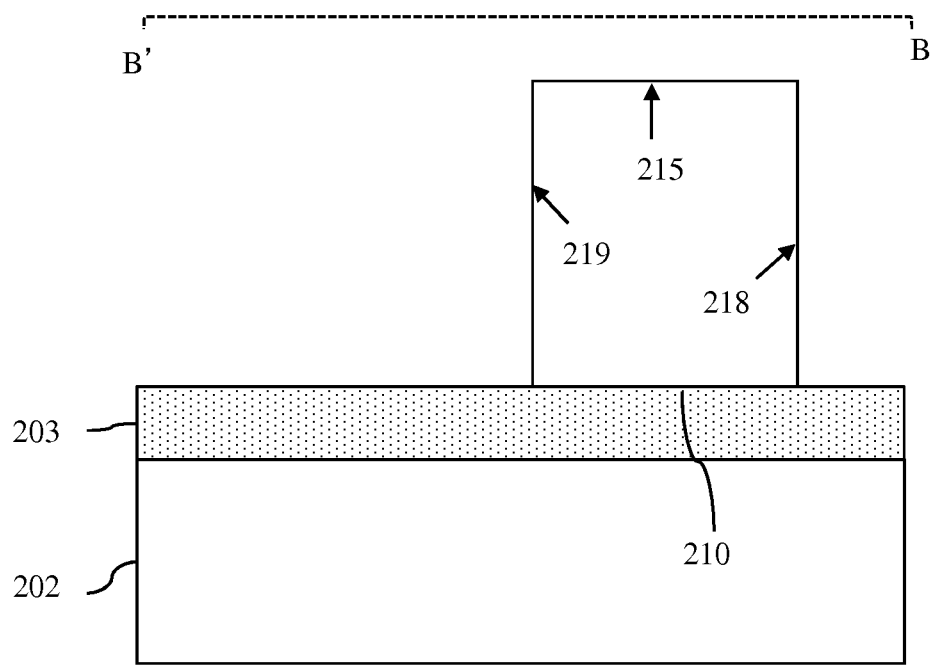
FIG. 15C is another cross-section diagram of the partially completed non-planar capacitor of FIG. 15A.

A second mask 1150 can then be formed (e.g., lithographically patterned) on the continuous semiconductor body(s) 1110 such that the second mask 1150 has a first opening 1151 exposing a region 1115 (e.g., an end region) of one of the side sections (e.g., side section 1113) and such that the second mask 1150 has second openings 1152 exposing the end sections 1111-1112 (1008, see FIG. 14). Then, a second etch process can be performed in order to remove both the region 1115 of the side section 1113 exposed in the first opening 1151 and the end sections 1111-1112 exposed in the second openings 1152 (1010). Removal of the region 1115 of the side section 1113 and the ends sections 1111-1112 will result in the formation of multiple discrete semiconductor bodies (e.g., semiconductor fins) and, particularly, a first semiconductor body 210 and one or more second semiconductor bodies 220a-c, wherein the first semiconductor body 210 comprises the remaining region of the side section 1113 and is positioned laterally adjacent to and shorter in length than the one or more second semiconductor bodies 220a-c (see FIGS. 15A-15C). In any case, as illustrated, the first semiconductor body 210 has a first top surface 215, first opposing sidewalls 216-217, and first opposing endwalls 218-219 and the one or more second semiconductor bodies 220a-c each have a second top surface 225, second opposing sidewalls 226-227 and second opposing endwalls 228-229.

Referring again to the flow diagram of FIG. 9, either before or after the first semiconductor body 210 and the one or more second semiconductor bodies 220a-c are formed at least one dopant implantation process can be performed in order to ensure that the first semiconductor body 210 and the one or more second semiconductor bodies 220a-c each have the same type conductivity (e.g., N-type conductivity or P-type conductivity) across their length, width and height (906). This dopant implantation process can be performed such that the first semiconductor body 210 and the one or more second semiconductor bodies 220a-c each have essentially uniform N-type or P-type conductivity. That is, this dopant implantation process can be performed such that the first semiconductor body 210 and the one or more second semiconductor bodies 220a-c are each essentially uniformly doped with a N-type or P-type dopant so as to have essentially uniform conductivity in terms of both type and level across their length, width and height. Alternatively, the dopant implantation process can be performed such that the first semiconductor body 210 and the one or more second semiconductor bodies 220a-c each have essentially uniform conductivity in terms of type, but also each have one or more regions (e.g., a contact region) with a relatively high conductivity level as compared to other regions contained therein.

The method can further comprise forming a gate stack 240 that traverses a first portion 211 and, particularly, an end portion of the first semiconductor body 210 and that also traverses a second portion 221 of each second semiconductor body 220a-c (908, see FIGS. 2A-2C).

One exemplary technique for forming that gate stack 240 can comprise forming (e.g., depositing) at least one conformal gate dielectric layer 241 over the first semiconductor body 210 and the one or more second semiconductor bodies 220a-c and forming (e.g., depositing) at least one blanket conductor layer 242 over the dielectric layer 242. The dielectric and conductor layers 241-242 can subsequently be lithographically patterned and etched so that the resulting gate stack 240 traverses the first portion 211 of the first semiconductor body 210 (i.e., the end portion of the first semiconductor body) and, particularly, is positioned adjacent to that first portion 211 on the first top surface 215, on the first opposing sidewalls 216-217 and on one of the first opposing endwalls (e.g., first opposing endwall 219). The dielectric and conductor layers 241-242 can further be lithographically patterned and etched so that the resulting gate stack 240 also traverses a second portion 221 of each second semiconductor body 220a-c and, particularly, is positioned adjacent to a second portion 221 of each second semiconductor body 220a-c on the second top surface 225, on the second opposing sidewalls 226-227, and positioned laterally between the second opposing endwalls 218-219. It should be noted that the exemplary technique for forming a gate stack 240, as described above, is offered for illustration purposes. Various different techniques for forming a gate stack on multiple semiconductor bodies are well known in the art and any of these techniques could, alternatively, be incorporated into the disclosed method. Although the gate stack 240 is illustrated as being formed using only a single dielectric layer and a single conductor layer, the figures are not intended to be limiting and it should be understood that more than one dielectric layer and/or more than one conductor layer could, alternatively, be used.

In any case, with this configuration, the first portion 211 of the first semiconductor body 210 and second portion(s) 221 of the one or more second semiconductor bodies 220a-c traversed by the gate stack 240 can function as first capacitor conductors. The dielectric layer 241 of the gate stack 240 can function as a capacitor dielectric and the conductive layer 242 of the gate stack 240 can function as a second capacitor conductor opposite the first capacitor conductors.

The processes 904 and 908 used to form the first semiconductor body 210 and the one or more second semiconductor bodies 220a-c and the gate stack 240, respectively, can be performed such that the first portion 211 of the first semiconductor body 210 traversed by the gate stack 240 has a first length 251 and such that the gate stack 240 has a second length 252 that is greater than the first length 251, as measured in a direction parallel to the first semiconductor body 210. This second length 252 can, for example, be a fixed length. Specifically, this second length 252 can be set for the gate stack 240 by the design rules for the particular multi-gate non-planar field effect transistor (MUGFET) technology within which the processes used to form the non-planar capacitor 200 are integrated. Alternatively, this second length 252 can be set so that it is different than the gate length set by the design rules for the particular multi-gate non-planar field effect transistor (MUGFET) technology.

Due to the different lengths of the gate stack 240 and the first portion 211 of the first semiconductor body 210 traversed by the gate stack 240, the endwall 219 of the semiconductor body 210 will be below the top surface of the gate stack 240 and the gate stack 240 will extend laterally some distance beyond the first portion 211 and, particularly, beyond the endwall 219 of the first semiconductor body 210. The processes 904 and 908 used to form the first semiconductor body 210 and the one or more second semiconductor bodies 220a-c and the gate stack 240, respectively, should further be performed such that the first length 251 of the first portion 211 of the first semiconductor body 210 (i.e., the length of the end portion of the semiconductor body 210 that is to be traversed by the gate stack 240) and, thereby the length of the first conductive plate in the first semiconductor body 210 of the non-planar capacitor 200 is a specific length, which is predetermined in order to ensure that the non-planar capacitor 200 has a predetermined capacitance value (i.e., a desired capacitance). That is, this first length 251 of the first portion 211 (i.e., end portion) of the first semiconductor body 210 that is adjacent to the gate stack 240 can be selectively adjusted (i.e., controlled during processing) in order to finely tune the capacitance of the non-planar capacitor 200. To accomplish this, the second mask can be formed at process 1008 above and the second etch process can be performed at process 1010 above in order to cut the side section 1113 at a predetermined location so that, when the gate stack 240 is formed at process 908, the first length of the first portion of the first semiconductor body traversed by the gate stack will be the specific length, which ensures that the non-planar capacitor has the predetermined capacitance value.

Figure 16:
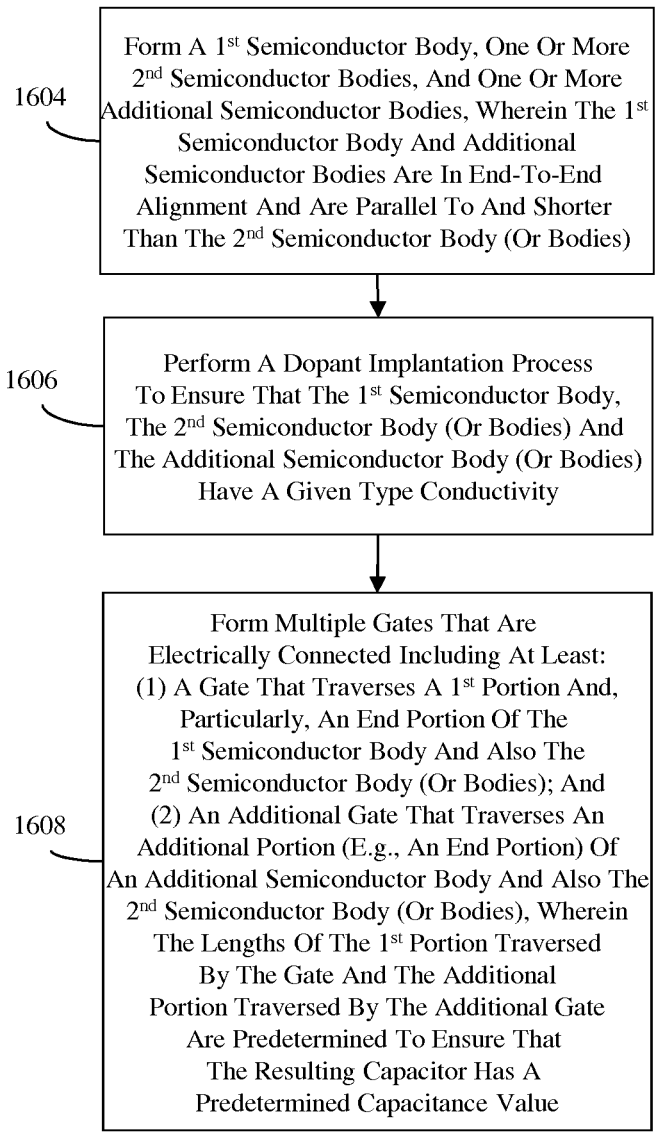
FIG. 16 is a flow diagram illustrating a method of forming a non-planar capacitor such as the non-planar capacitor of FIGS. 3A-3C.

FIG. 16 is a flow diagram illustrating a method of forming yet another non-planar capacitor, such as a multi-body multi-gate finger non-planar capacitor 300, as illustrated in FIGS. 3A-3C.

In this method, multiple semiconductor bodies, including a first semiconductor body 310, one or more second semiconductor bodies 320a-c, and one or more additional semiconductor bodies 330a-b can be formed (1604).

For example, as illustrated in FIG. 7, the method can comprise providing a semiconductor-on-insulator (SOI) wafer 301 that comprises, for example, a semiconductor substrate 302 (e.g., a silicon substrate or any other suitable semiconductor substrate); an isolation layer 303 (e.g., a silicon dioxide (SiO$_2$) layer, a sapphire layer or any other suitable isolation layer layer) on the semiconductor substrate 302 and a semiconductor layer 304 (e.g., a silicon layer, a gallium nitride layer, or any other suitable semiconductor layer) on the isolation layer 303. Alternatively, the method can comprise providing a bulk semiconductor wafer 301 (e.g., a bulk silicon wafer or any other suitable semiconductor wafer), wherein a lower portion 302 of the wafer is isolated from an upper portion 304 of the wafer by a buried isolation layer 303 (e.g., a buried well region). Alternatively, the method can comprise providing a bulk semiconductor wafer (e.g., a bulk silicon wafer or any other suitable semiconductor wafer) and without the above described buried isolation region (not shown). It should be noted that, when the semiconductor bodies 310, 320a-c and 330a-b are formed above an isolation layer 203 (or above an isolation region of a bulk semiconductor wafer, if applicable), they could be connected to ground or biased. However, when the semiconductor bodies 310, 320a-c and 330a-b are formed using a bulk semiconductor substrate without a buried isolation region, they will be floated (i.e., will not biased or connected to ground).

The method can further comprise forming, at process 1604, a first semiconductor body 310, one or more second semiconductor bodies 320a-c, and one or more additional semiconductor bodies 330a-b from the semiconductor layer 304 (or from the upper portion 304 of the bulk semiconductor wafer, if applicable). The first semiconductor body 310, the one or more second semiconductor bodies 320a-c and the one or more additional semiconductor bodies 330a-b can be formed so that the first semiconductor body 310 has a first top surface 315, first opposing sidewalls 316-317 and first opposing endwalls 318-319, so that the one or more second semiconductor bodies 320a-c have a second top surface 325, second opposing sidewalls 326-327 and second opposing endwalls 328-329, so that the one or more additional semiconductor bodies 330a-b each have an additional top surface 335, additional opposing sidewalls 336-337 and additional opposing endwalls 338-339. The first semiconductor body 310, the one or more second semiconductor bodies 320a-c and the one or more additional semiconductor semiconductor bodies 330a-b can, for example, be formed such that the first semiconductor body 310 and the one or more additional semiconductor bodies 330a-b are in end-to-end alignment and are positioned laterally adjacent to and shorter in length than the second semiconductor bodies 320a-c.

The first semiconductor body 310, the one or more second semiconductor bodies 320a-c, and additional semiconductor bodies 330a-b can be formed, for example, using a conventional semiconductor body formation technique (e.g., a lithographic patterning and etch technique, a sidewall image transfer (SIT) technique or any other suitable semiconductor body formation technique). Optionally, these techniques can be performed so that the resulting semiconductor bodies 310, 320a-c, and 330a-b have the same width, the same height and a uniform pitch (e.g., as set by the design rules for the particular multi-gate non-planar field effect transistor (MUG-FET) technology within which the processes used to form the non-planar capacitor 300 are integrated). Alternatively, these techniques can be performed so that the semiconductor body specifications (i.e., the semiconductor body width, height and/or pitch) are different than those set by the design rules for the particular multi-gate non-planar field effect transistor (MUGFET) technology. In any case, one or more additional process steps can be incorporated into the conventional semiconductor body formation technique in order to form the first semiconductor body 310 and the one or more additional semiconductor bodies 330a-b positioned laterally adjacent to (e.g., parallel to, substantially parallel to, etc.) and shorter than the one or more second semiconductor bodies 320a-c.

Figure 17:
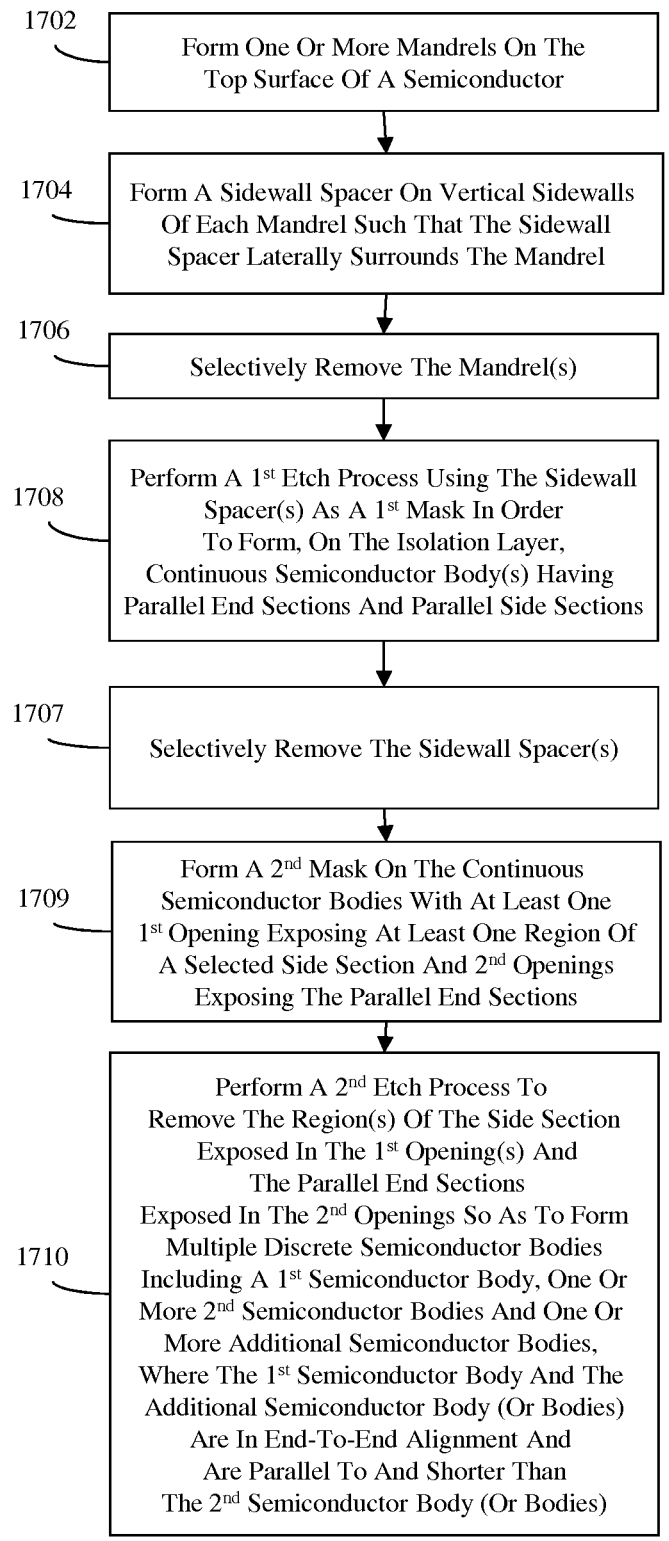
FIG. 17 is a flow diagram illustrating in greater detail process 1604 of the flow diagram of FIG. 16.
Figure 18:
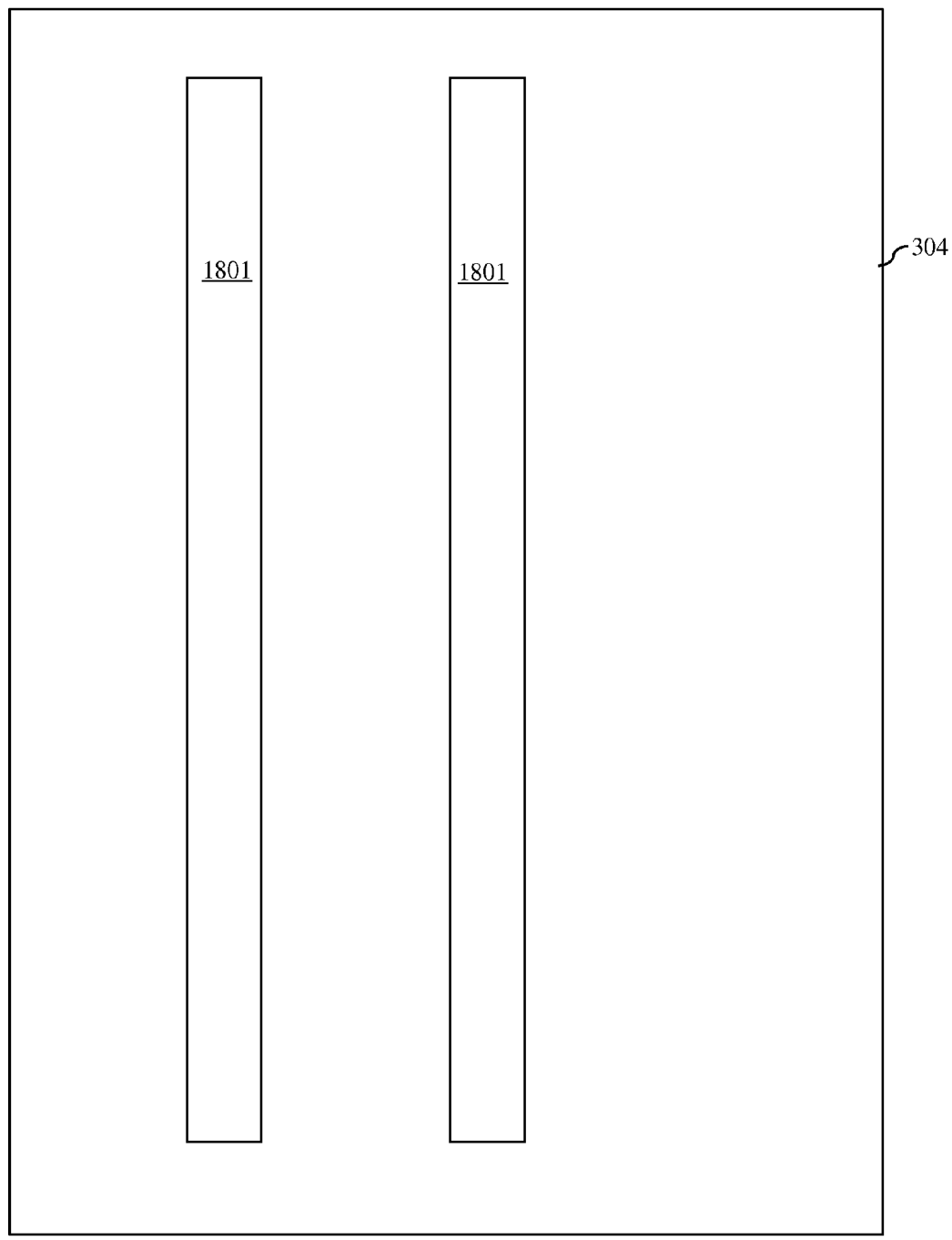
FIG. 18 is a top view diagram of a partially completed non-planar capacitor formed according to the method of FIGS. 16-17.

FIG. 17 is a flow diagram illustrating one exemplary technique that can be used to form the first semiconductor body 310, the one or more second semiconductor bodies 320a-c and the one or more additional semiconductor bodies 330a-b at process 1604. Specifically, at least one mandrel 1801 can be formed on the top surface of the semiconductor layer 304 (1702, see FIG. 18). For purposes of this disclosure a mandrel comprises a sacrificial body that can be formed and subsequently selectively removed (see more detailed discussion below). The mandrel can, for example, be a rectangular prism in shape (as illustrated). Alternatively, the shape of the mandrel can be that of a different three-dimensional parallelogram, a three-dimensional trapezoid or any other suitable three-dimensional shape. It should be noted that two mandrels are shown for illustration purposes; however, it should be understood that any number of one or more mandrels 1601 could, alternatively, be formed.

Figure 19:
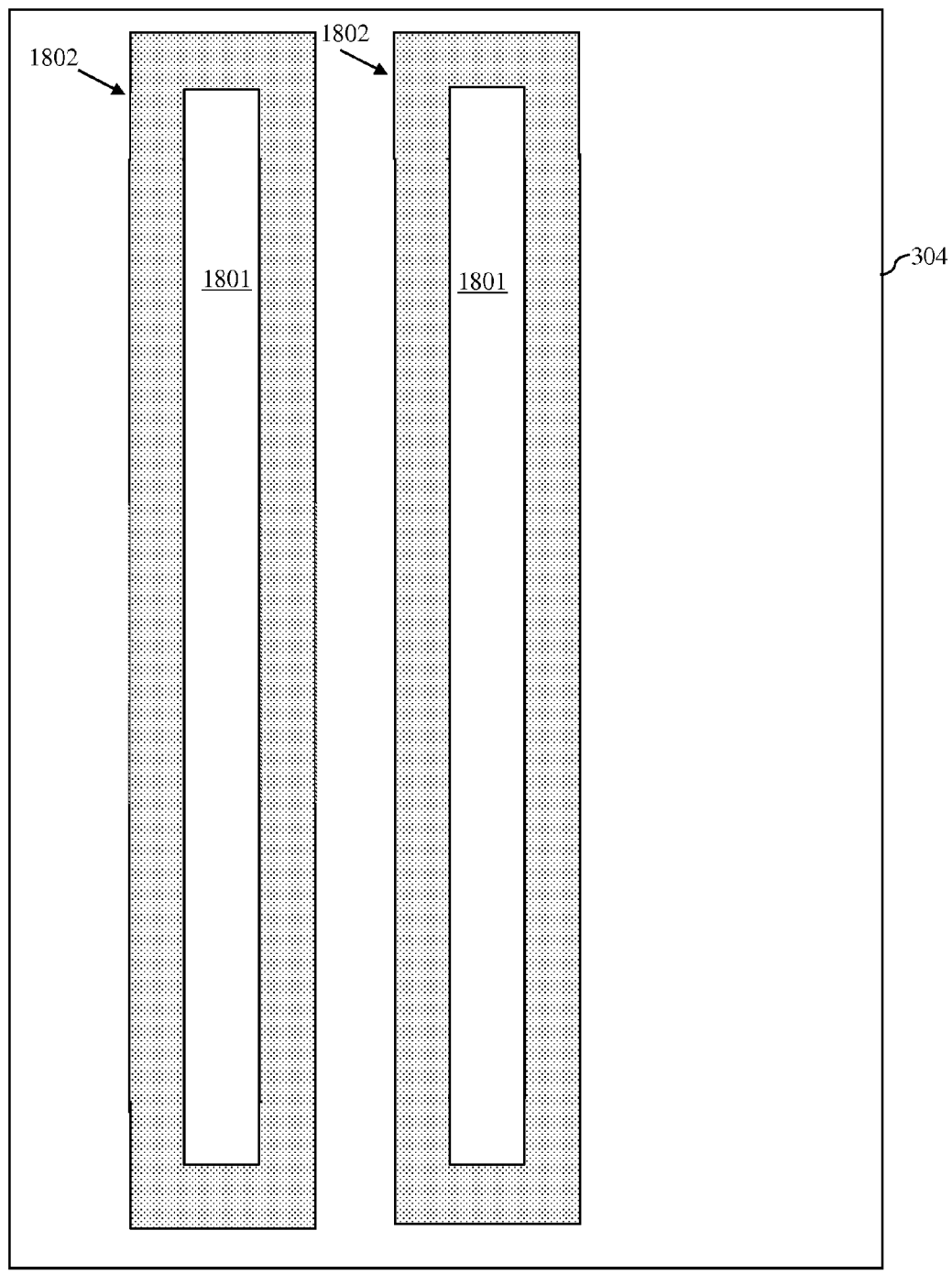
FIG. 19 is a top view diagram of a partially completed non-planar capacitor formed according to the method of FIGS. 16-17.

A sidewall spacer 1802 can subsequently be formed on vertical sidewalls of each mandrel so as to laterally surround that mandrel (1704, see FIG. 19). For example, a spacer material layer can be conformally deposited over the mandrel(s) 1801 and an anisotropic etch process can be performed so as to remove the spacer material layer from horizontal surfaces of the semiconductor layer 304 (or bulk semiconductor wafer, if applicable) and mandrel(s) 1801 and so as to leave the spacer material on the vertical surfaces of the mandrel(s) 1801 intact.

After the sidewall spacer(s) 1802 are formed, the mandrel(s) 1801 can be selectively removed (1706). It should be noted that the spacer material layer and, thereby the sidewall spacer(s) 1802 can comprise, for example, a dielectric material (e.g., silicon oxide, silicon nitride, silicon oxynitride, etc.) and the mandrel(s) 1801 can comprise, for example, either a different dielectric material or polysilicon such that the mandrel(s) 1801 can be selectively etched over the sidewall spacer(s) 1802 and the semiconductor layer 304.

Figure 20:
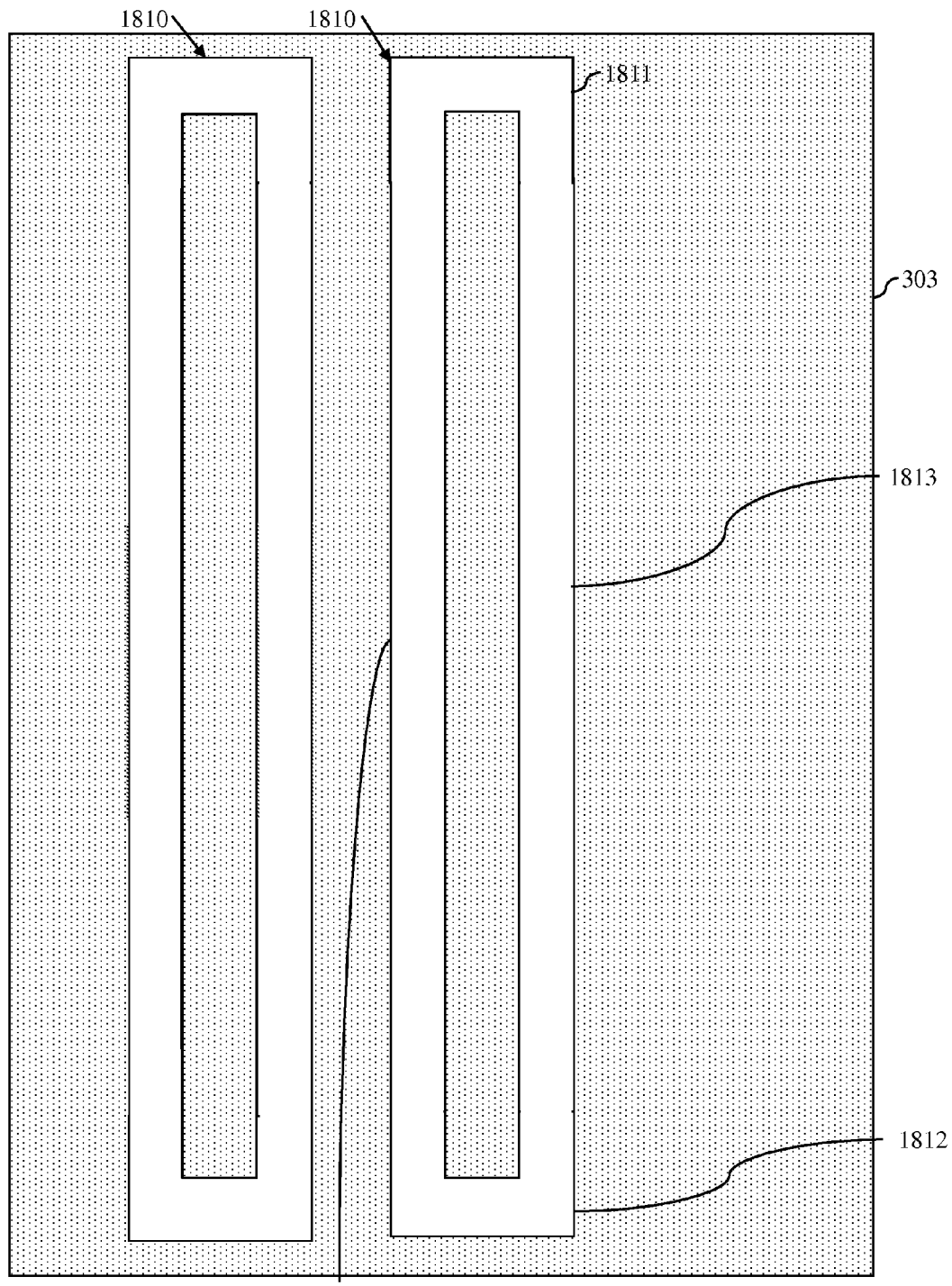
FIG. 20 is a top view diagram of a partially completed non-planar capacitor formed according to the method of FIGS. 16-17.

Next, a first etch process (e.g., an anisotropic etch process) can be performed using the sidewall spacer(s) 1802 as a first mask in order to form, from the semiconductor layer 304 above the isolation layer 303 (or from the upper portion of the bulk semiconductor wafer, if applicable), continuous semiconductor body(s) 1810, each having side sections 1813-1814 and end sections 1811-1812 (1708, see FIG. 20). Once the continuous semiconductor body(s) 1810 are formed, the sidewall spacer(s) 1802 can be selectively removed (1707).

Figure 21:
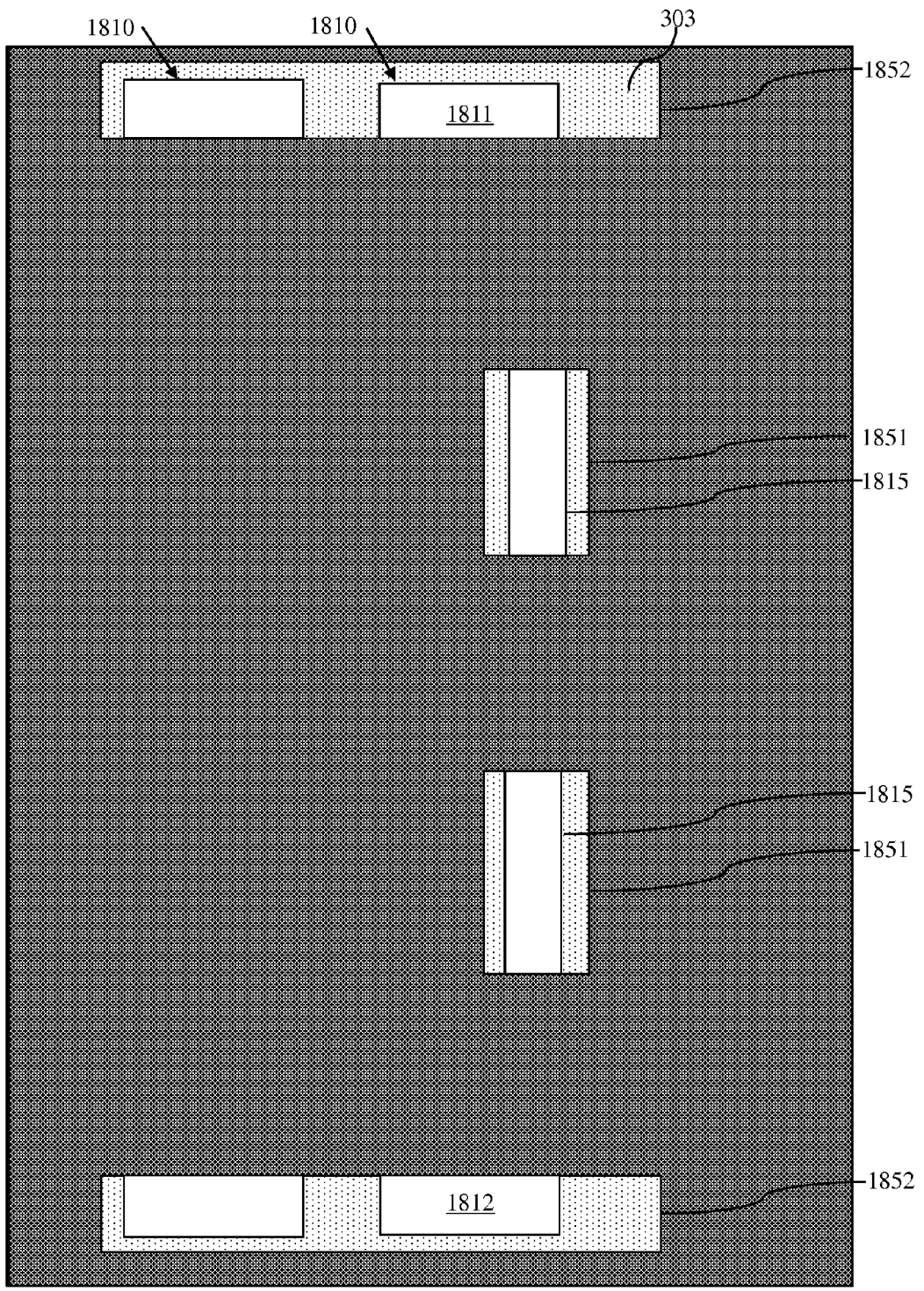
FIG. 21 is a top view diagram of a partially completed non-planar capacitor formed according to the method of FIGS. 16-17.

A second mask 1850 can then be formed (e.g., lithographically patterned) on the continuous semiconductor body(s) 1810 such that the second mask 1850 has one or more first openings 1851 exposing one or more regions 1815 of one of the side sections (e.g., side section 1813) and such that the second mask 1850 has second openings 1852 exposing the end sections 1811-1812 (1708, see FIG. 21).

Figure 22A:
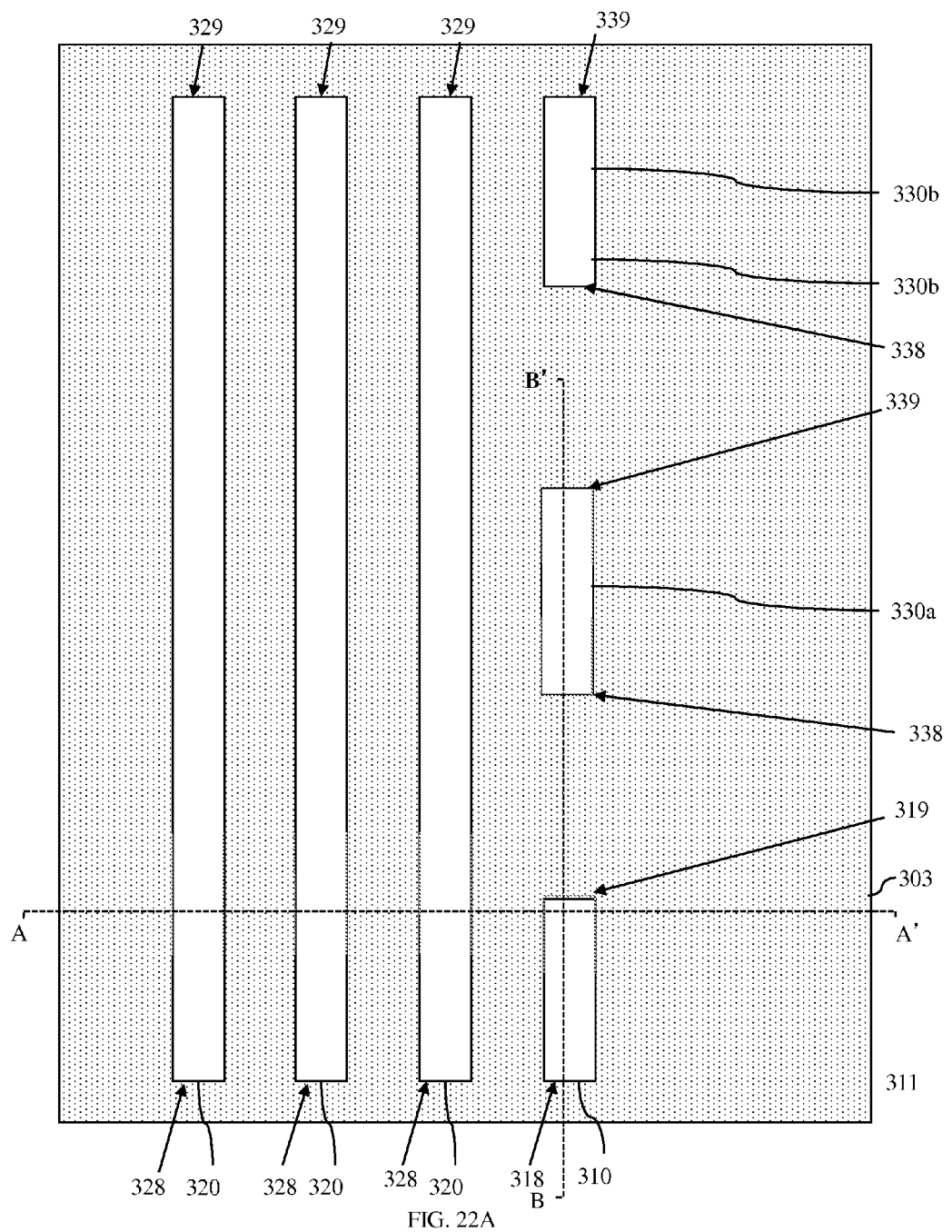
FIG. 22A is a top view diagram of a partially completed non-planar capacitor formed according to the method of FIGS. 16-17.
Figure 22B:
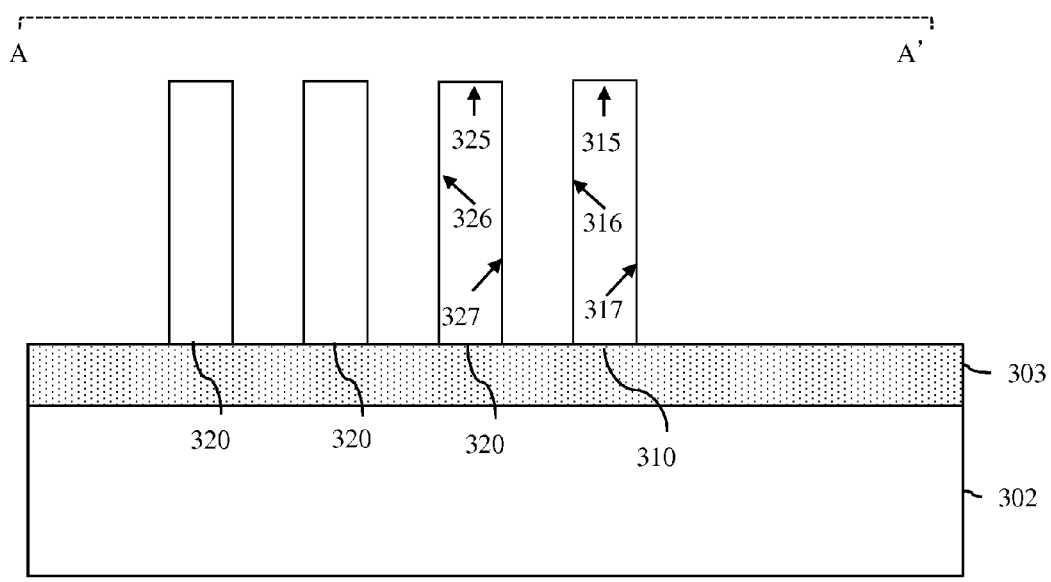
FIG. 22B is a cross-section diagram of the partially completed non-planar capacitor of FIG. 22A; and, FIG. 22C is another cross-section diagram of the partially completed non-planar capacitor of FIG. 22A.
Figure 22C:
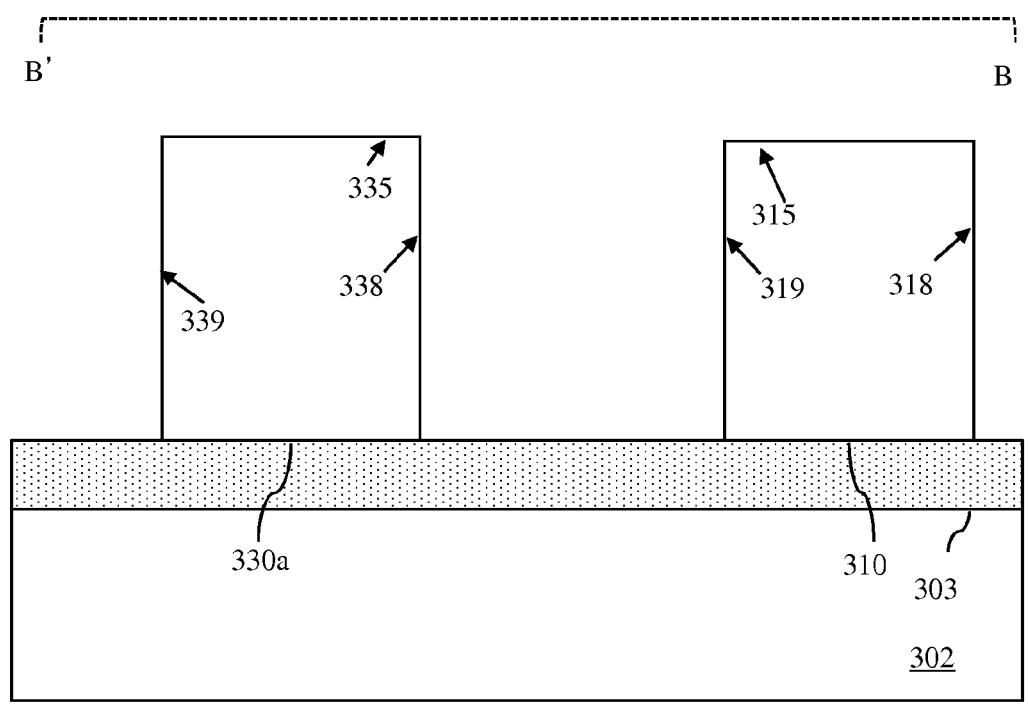

It should be noted the first opening(s) 1851 can be between and separated from the second openings 1852. Then, a second etch process can be performed in order to remove both the region(s) 1815 of the side section 1813 exposed in the first opening(s) 1851 and the end sections 1811-1812 exposed in the second openings 1852 (1710). Removal of the region(s) 1815 of the side section 1813 and the ends sections 1811-1812 will result in the formation of multiple discrete semiconductor bodies and, particularly, a first semiconductor body 310, one or more second semiconductor bodies 320*a-c*, and one or more additional semiconductor bodies 330*a-b*, wherein the first semiconductor body 310 and the one or more additional semiconductor bodies 330*a-b* comprise remaining regions of the side section 1813 such that they are in end-to-end alignment and such that they are positioned laterally adjacent to (e.g., parallel to (as illustrated), substantially parallel to, slightly angled relative to, etc.) and shorter than the one or more second semiconductor bodies 320*a-c* (see FIGS. 22A-22C). As illustrated, the resulting first semiconductor body 310 has a first top surface 315, first opposing sidewalls 316-317, and first opposing endwalls 318-319, the one or more second semiconductor bodies 320*a-c* each have a second top surface 325, second opposing sidewalls 326-327 and second opposing endwalls 328-329, and the one or more additional semiconductor bodies 330*a-b* each have an additional to surface 335, additional opposing sidewalls 336-337 and additional opposing endwalls 338-339.

Referring again to the flow diagram of FIG. 16, either before or after the first semiconductor body 310, the one or more second semiconductor bodies 320*a-c* and the one or more additional semiconductor bodies 330*a-b* are formed at least one dopant implantation process can be performed in order to ensure that the first semiconductor body 310, the one or more second semiconductor bodies 320*a-c* and the one or more additional semiconductor bodies 330*a-b* each have the same type conductivity (e.g., N-type conductivity or P-type conductivity) across their length, width and height (1606). This dopant implantation process can be performed such that the first semiconductor body 310, the one or more second semiconductor bodies 320*a-c* and the one or more additional semiconductor bodies 330*a-b* each have essentially uniform N-type or P-type conductivity. That is, this dopant implantation process can be performed such that the first semiconductor body 310, the one or more second semiconductor bodies 320*a-c* and the one or more additional semiconductor bodies 330*a-b* are each essentially uniformly doped with a N-type or P-type dopant so as to have essentially uniform conductivity in terms of both type and level across their length, width and height. Alternatively, the dopant implantation process can be performed such that the first semiconductor body 310, the one or more second semiconductor bodies 320*a-c* and the one or more additional semiconductor bodies 330*a-b* each have essentially uniform conductivity in terms of type, but also each have one or more regions (e.g., a contact region) with a relatively high conductivity level as compared to other regions contained therein.

The method can further comprise forming multiple gate stacks that are electrically connected including, a gate stack 340 that traverses a first portion 311 and, particularly, an end portion of the first semiconductor body 310 as well as a second portion 321 of each second semiconductor body 320*a-c* and one or more additional gate stacks 345*a-c*, each traversing an additional portion of at least one additional semiconductor body 330*a-b* as well as other second portions of each second semiconductor body 320*a-c* (1608, see FIGS. 3A-3C).

One exemplary technique for forming the multiple gate stacks 340 and 345*a-c* can comprise forming (e.g., depositing) at least one conformal gate dielectric layer 341 over the first semiconductor body 310, the one or more second semiconductor bodies 320*a-c* and the one or more additional semiconductor bodies 330*a-b* and forming (e.g., depositing) at least one blanket conductor layer 342 over the dielectric layer 342. The dielectric and conductor layers 341-342 can subsequently be lithographically patterned and etched so that the resulting gate stack 340 traverses the first portion 311 of the first semiconductor body 310 (i.e., the end portion of the first semiconductor body) and, particularly, is positioned adjacent to that first portion 311 on the first top surface 315, on the first opposing sidewalls 316-317 and on one of the first opposing endwalls (e.g., first opposing endwall 319). The dielectric and conductor layers 341-342 can further be lithographically patterned and etched so that the resulting gate stack 340 also traverses a second portion 321 of each second semiconductor body 320*a-c* and, particularly, is positioned adjacent to a second portion 321 of each second semiconductor body 320*a-c* on the second top surface 325, on the second opposing sidewalls 326-327, and positioned laterally between the second opposing endwalls 328-329. The dielectric and conductor layers 341-342 can further be lithographically patterned and etched so that each of the resulting additional gate stacks 345*a-b* traverses an additional portion (e.g., 331*a*, 331*b*, or 331*c*) of at least one additional semiconductor body (e.g., 330*a* or 330*b*) and, particularly, is positioned adjacent to that additional portion on the additional top surface 335, on the additional opposing sidewalls 336-337 and either on one of the additional opposing endwalls 338-339 (as shown) or, alternatively, positioned laterally between the additional opposing endwalls 338-339 (not shown). For example, as illustrated, additional gate stack 345*a* can traverse the additional portion 331*a* of the additional semiconductor body 330*a* at its endwall 338. The additional gate stack 345*b* can traverse the additional portion 331*b* of the same additional semiconductor body 330*a* at its opposing endwall 339. The additional gate stack 345*c* can traverse the additional portion 331*c* of the additional semiconductor body 330*b* at its endwall 338. The dielectric and conductor layers 341-342 can further be lithographically patterned and etched so that each of the resulting additional gate stacks 345a-c also traverses another second portion of each second semiconductor body 320a-c.

Optionally, the dielectric and conductor layers 341-342 can further be lithographically patterned and etched so that the gate stack 340 and each of the resulting additional gate stacks 345a-c are all electrically connected by a gate connector 346 that is perpendicular to and immediately adjacent to ends of the gate stacks 340 and additional gate stack(s) 345a-c (as shown). It should be noted that the exemplary technique for forming the gate stacks 340 and 345a-c, as described above, is offered for illustration purposes. Various different techniques for forming a gate stack on multiple semiconductor bodies are well known in the art and any of these techniques could, alternatively, be incorporated into the disclosed method. Although the gate stacks 340 and 345a-c are illustrated as being formed using only a single dielectric layer and a single conductor layer, the figures are not intended to be limiting and it should be understood that more than one dielectric layer and/or more than one conductor layer could, alternatively, be used.

In any case, with this configuration, the first portion 311 of the first semiconductor body 310, second portion(s) 321 of the one or more second semiconductor bodies 320a-c and additional portion(s) (e.g., see additional portions 331a, 331b and 331c) of the one or more additional semiconductor bodies 330a-b traversed by the gate stacks 340 and 345a-c can function as first capacitor conductors. The dielectric layer 341 of the gate stacks 340 and 345a-c can function as a capacitor dielectric and the conductive layer 342 of the gate stacks 340 and 345a-c can function as second capacitor conductors opposite the first capacitor conductors.

The processes 1604 and 1608 used to form the first semiconductor body 310, the one or more second semiconductor bodies 320a-c and the one or more additional semiconductor bodies 330a-b and the gate stacks 340 and 345a-c, respectively, can be performed such that the first portion 311 of the first semiconductor body 310 traversed by the gate stack 340 has a first length 351 and such that the gate stacks 340 and 345a-c each have the same second length 352 that is greater than the first length 351, as measured in a direction parallel to the first semiconductor body 310. This second length 352 can, for example, be a fixed length. As mentioned above, the second length 352 can, for example, be set for the gate stacks by the design rules for the particular multi-gate non-planar field effect transistor (MUGFET) technology within which the processes used to form the non-planar capacitor 300 are integrated. Alternatively, this second length 352 can be set such that it different than that set by the design rules for the particular multi-gate non-planar field effect transistor (MUGFET) technology.

Due to the different lengths of the gate stack 340 and the first portion 311 of the first semiconductor body 310 traversed by that gate stack 340, the endwall 319 of the first semiconductor body 310 will be below the top surface of the gate stack 340 and the gate stack 340 will extend laterally some distance beyond the first portion 311 and, particularly, beyond the endwall 319 of the first semiconductor body 310. Similarly, due to the different lengths of the additional gate stack 345a and the end portion 331a of the additional semiconductor body 330a traversed by that gate stack 345a, the endwall 338 of the additional semiconductor body 330a will be below the top surface of the gate stack 345a and the gate stack 345a will extend laterally some distance beyond the additional portion 331a and, particularly, beyond the endwall 338 of the additional semiconductor body 330a; due to the different lengths of the additional gate stack 345b and the end portion 331b of the additional semiconductor body 330a traversed by that gate stack 345b, the endwall 339 of the additional semiconductor body 330a will be below the top surface of the gate stack 345b and the gate stack 345b will extend laterally some distance beyond the additional portion 331b and, particularly, beyond the endwall 339 of the additional semiconductor body 330a; and so on.

The processes 1604 and 1608 used to form the first semiconductor body 310, the one or more second semiconductor bodies 320a-c and the one or more additional semiconductor bodies 330a-b and the gate stacks 340 and 345a-c, respectively, should further be performed such that the first length 351 (i.e., the length of the end portion of the first semiconductor body 310 that is to be traversed by the gate stack 340) and any additional length (i.e., the length of any additional portion 331a-c of any additional semiconductor body 330a-b traversed by an additional gate stack 345a-c) and, thereby the lengths of the first capacitor conductors in the first semiconductor body 310 and the one or more additional semiconductor bodies 330a-b are specific lengths, which are predetermined in order to ensure that the non-planar capacitor 300 has a predetermined capacitance value (i.e., a desired capacitance). That is, this first length 351 of the end portion 311 of the first semiconductor body 310 adjacent to the gate stack 340 as well as the additional length(s) 353 of any additional portions 331a-c of any additional semiconductor bodies 330a-b adjacent to any additional gate stacks 345a-c can be selectively adjusted (i.e., controlled during processing) in order to finely tune the capacitance of the non-planar capacitor 300. To accomplish this, the second mask can be formed at process 1709 above and the second etch process can be performed at process 1710 above in order to cut the side section 1813 at predetermined locations so that, when the gate stack 340 and additional gate stacks 342a-c are formed at process 1608, the non-planar capacitor has the predetermined capacitance value.

The etch processes described in the different methods above can result in semiconductor bodies having an essentially rectangular prism shape (as illustrated). However, it should be understood that, due to the etching specifications and/or the semiconductor material used, the shape of the semiconductor bodies may vary slightly. For example, the sidewalls of each semiconductor body may be angled or curved as opposed to perpendicular relative to the substrate such that the width tapers toward the top of the semiconductor body.

Those skilled in the art will recognize that that mask overlay misalignment associated with the second mask 1850 used at process 1708 in the flow diagram of FIG. 17 to form the semiconductor bodies 310, 320a-c and 330a-b and any mask used at process 1608 in the flow diagram of FIG. 16 to form the multiple gate stacks 340 and 345a-c may cause variations in the first length 351 of the first portion 311 of the first semiconductor body 310 adjacent to the gate stack 340 or the additional lengths 353 of the additional portions 331a-c of the additional semiconductor bodies 330a-b adjacent to the additional gate stacks 345a-c and, thereby may cause variations in the capacitance value of the non-planar capacitor 300. Therefore, the process 1708 of forming the second mask 1850, as described above and illustrated in FIG. 21, can specifically be performed so as to compensate for such mask overlay misalignment.

Specifically, the second mask 1850 can be formed such that the first opening(s) 1851 expose selected region(s) 1815 of the side section 1813. These selected region(s) 1815 can be extended laterally between and into designated channel regions of that side section 1813. That is, the selected region(s) 1815 can be greater in length than and can include an entire designated source/drain region between adjacent designated channel regions in the side section 1813. These selected region(s) 1815, if left intact during subsequent processing, would extend between and partially below two adjacent gate stacks. However, as a result of the etch process 1710, following gate stack formation, the first semiconductor body 310 and the last additional semiconductor body 330b formed from the side section 1813 will each have a single end portion 311 and 331c traversed by gate stacks 340 and 345c, respectively; whereas any additional semiconductor body that is between the first semiconductor body 310 and the last additional semiconductor body 330b (e.g., see additional semiconductor body 330a) will have opposing end portions 331a-b traversed by adjacent additional gate stacks (e.g., see additional gate stacks 345a and 345b). Patterning of the first semiconductor body 310 and the one or more additional semiconductor bodies 330a-b in this manner ensures that even with mask overlay misalignment, the total length of the portions 311 and 331a-c of the first semiconductor body 310 and the one or more additional semiconductor bodies 330a-b, respectively, adjacent to gate stacks 340 and 345a-c will remain constant. That is, if due to mask overlay misalignment, the gate stacks 340 and 345a-c do not land at the desired location, a shift that results in the first portion 311 of the first semiconductor body 310 and one end portion 331b of the additional semiconductor body 330a having shorter lengths than desired will also result in the end portion 331c of the last additional semiconductor body 330b and the end portion 331a of the additional semiconductor body 330a having corresponding longer lengths than desired. Thus, the capacitance value of the non-planar capacitor 300 will remain essentially constant.

The descriptions of the various method embodiments of the present invention have been presented above for purposes of illustration, but are not intended to be exhaustive or limited to the embodiments disclosed. Many modifications and variations will be apparent to those of ordinary skill in the art without departing from the scope and spirit of the described embodiments. For example, similar semiconductor body formation and gate stack patterning techniques could, for example, be used to form yet another non-planar capacitor 400, as illustrated in FIG. 4, wherein a first portion 411 and, particularly, an end portion of a first semiconductor body 410 is traversed by a first side 441 of a gate stack 440 and an additional portion 431 and, particularly, an adjacent end portion of an additional semiconductor body 430 in end-to-end alignment with the first semiconductor body 410 is traversed by a second side 442 of the same gate stack 440. In this case, the lengths of the first portion 411 of the first semiconductor body 410 and of the additional portion 431 of the additional semiconductor body 430, which are traversed by the gate stack 440, can be either the same or different (as shown). Similar semiconductor formation and gate stack patterning techniques could also be used to form yet another non-planar capacitor 500, as illustrated in FIG. 5, wherein a first portion 511 and, particularly, an end portion of a first semiconductor body 510 is traversed by a first side 541 of a gate stack 540 and an additional portion 531 of an additional semiconductor body 530, which is offset from the first semiconductor body 510, is traversed by a second side 542 of the same gate stack 540. Again, the lengths of the first portion 511 of the first semiconductor body 510 and of the additional portion 531 of the additional semiconductor body 530, which are traversed by the gate stack 540, can be either the same or different (as shown). Similar features to those shown in FIGS. 4 and 5 and mentioned above could also be incorporated into methods used to form multi-gate finger non-planar capacitors.

In additional to the method steps describe above, the methods of forming the non-planar capacitors 100, 200, 300, 400, 500 can further comprise forming contacts to each of the semiconductor bodies and, thereby to first conductive plates contained therein, as well as contacts to the gate stack (or gate stacks, as applicable) and, thereby to second conductive plates contained therein. Alternatively, the methods of forming the multi-body non-planar capacitors 200 and 300 can further comprise merging (e.g., by forming forming an epitaxial semiconductor layer) or electrically connecting (e.g., by forming a conductive strap) the exposed portions of the semiconductor bodies on opposing sides of the gate stack (or gate stacks, as applicable) so as to correspond with the design rules for the particular multi-gate non-planar field effect transistor (MUGFET) technology within which the processes used to form the non-planar capacitors are integrated. In this case, contacts can subsequently be formed to the epitaxial semiconductor layer or conductive strap, as applicable, as opposed to contacting each individual semiconductor body.

Those skilled in the art will recognize that generally analog device have design specifications that require relatively long gate lengths as compared to the gate lengths for digital devices. Therefore, integrating the above-described methods into multi-gate non-planar field effect transistor (MUGFET) technology used for analog devices will provide more flexibility in terms of selectively adjusting the capacitance value of the non-planar capacitors.

Those skilled in the art will also recognize that in the methods described above different dopants can be used to achieve the desired conductivity types and that the dopants may vary depending upon the different semiconductor materials used. For example, a silicon-based semiconductor material having N-type conductivity is typically doped with a N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (MG), whereas a gallium nitride (GaN)-based semiconductor material having N-type conductivity is typically doped with silicon (Si).

Additionally, in the methods described above, the dielectric layer(s) 141, 241, 341 used to form the gate stacks can comprise, for example, any one or more of the following: a silicon dioxide layer, a silicon nitride layer, a silicon oxynitride layer, a high-K dielectric layer, such as a hafnium (Hf)-based dielectric layer (e.g., hafnium oxide, hafnium silicon oxide, hafnium silicon oxynitride, hafnium aluminum oxide, etc.) or some other suitable high-K dielectric layer (e.g., aluminum oxide, tantalum oxide, zirconium oxide, etc.), or any other dielectric layer suitable for use as a dielectric plate for a capacitor. Furthermore, the conductor layer(s) 142, 242, 342 used to form the gate stacks can comprise, for example, any one or more of the following: a doped polysilicon conductor layer, a metal conductor layer and/or any other conductor layer suitable for use as a conductive plate for a capacitor. The different gate conductor materials may vary depending upon the conductivity type of the semiconductor body (or bodies). For example, when the semiconductor body (or bodies) are to have a N-type conductivity, the conductor layer(s) 142, 242, 342 can comprise an N-doped polysilicon layer and/or a stack of one or more metals and/or a metal alloys including, but not limited to, at least one metal conductor having, for example, a similar work function as an N-doped polysilicon layer such as, hafnium, zirconium, titanium, tantalum, aluminum, and alloys thereof, such as, hafnium carbide, zirconium carbide, titanium carbide, tantalum carbide, and aluminum carbide. When the semiconductor body (or bodies) are to have a P-type conductivity, the conductor layer(s) 142, 242, 342 can comprise a P-doped polysilicon layer and/or a stack of one or more metals and/or metal alloys including, but not limited to, at least one metal gate conductor having, for example, a similar work function to a P-type polysilicon layer such as, ruthenium, palladium, platinum, cobalt, and nickel, as well as metal oxides (e.g., aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.).

It should be noted that the methods as described above can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed [systems, methods and computer program products] and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are non-planar capacitors with finely tuned (i.e., selectively adjusted) capacitances and methods of forming these non-planar capacitors that can be readily integrated into the processes used in a design rule-dependent multi-gate non-planar field effect transistor (MUGFET) technology. The non-planar capacitors can each incorporate one or more semiconductor bodies and one or more gate stacks traversing the one or more semiconductor bodies. In such non-planar capacitors, any portion of a semiconductor body traversed by a gate stack functions as a first capacitor conductor and the gate stacks comprises a dielectric layer that functions as a capacitor dielectric and a conductor layer that functions as a second capacitor plate. In the non-planar capacitors disclosed herein at least one first semiconductor body can be etched so that it is shorter in length than other semiconductor bodies, which are incorporated into other non-planar devices and/or into the same non-planar capacitor. Additionally, at least one gate stack can be formed so that it traverses a first portion and, particularly, an end portion of the shortened first semiconductor body and further so that it extends laterally some distance beyond that first portion. In such non-planar capacitors, the length of the first portion of the first semiconductor body, which corresponds to the first capacitor conductor and which is traversed by the gate stack, can be predetermined in order to achieve a desired capacitance.

What is claimed is:

1. A non-planar capacitor comprising:
   a first semiconductor body having a first top surface, first opposing sidewalls and first opposing endwalls;
   at least one second semiconductor body parallel to said first semiconductor body, said at least one second semiconductor body being longer than the first semiconductor body and having a second top surface, second opposing sidewalls and second opposing endwalls; and,
   a gate structure comprising:
      a first gate stack traversing both said first semiconductor body and said second semiconductor body,
         said first gate stack being adjacent to said first semiconductor body on said first top surface, on said first opposing sidewalls and on one of said first opposing endwalls, and
         said first gate stack further being adjacent to said second semiconductor body on said second top surface and said second opposing sidewalls such that said second opposing endwalls are outside said first gate stack;
      a second gate stack parallel to said first gate stack,
         said second gate stack being positioned adjacent to a side of said first gate stack that covers said one of said first opposing endwalls so as to be physically separated from said first semiconductor body, and
         said second gate stack further being adjacent to said second semiconductor body on said second top surface and said second opposing sidewalls such that said second opposing endwalls are outside said second gate stack; and
      a connector parallel to said first semiconductor body and said second semiconductor body and electrically connecting said first gate stack and said second gate stack.

2. The non-planar capacitor of claim 1, said gate structure comprising a dielectric layer and a conductor layer on said dielectric layer.

3. The non-planar capacitor of claim 1, wherein a length of an end portion of said first semiconductor body covered by said first gate stack is predetermined to ensure that said non-planar capacitor has a predetermined capacitance value.

4. The non-planar capacitor of claim 1, said at least one second semiconductor body comprising multiple second semiconductor bodies all having a same length, said first gate stack and said second gate stack traversing said multiple second semiconductor bodies.

5. The non-planar capacitor of claim 1, further comprising:
multiple additional semiconductor bodies comprising at least:
a first additional semiconductor body in end-to-end alignment with said first semiconductor body, said second gate stack traversing a first end of the first additional semiconductor body; and
a second additional semiconductor body in end-to-end alignment with said first additional semiconductor body;
a third gate stack parallel and adjacent to said second gate stack, said third gate stack traversing a second end of said first additional semiconductor body opposite said first end, said third gate stack further traversing said second semiconductor body; and
a fourth gate stack parallel and adjacent to said third gate stack, said fourth gate stack traversing said second additional semiconductor body and said second semiconductor body,
said connector further electrically connecting said third gate stack to said second gate stack and said fourth gate stack.

6. The non-planar capacitor of claim 5, said first gate stack, said second gate stack, said third gate stack and said fourth gate stack having equal lengths and a uniform pitch.

7. A method of forming a non-planar capacitor, said method comprising:
forming, above an isolation layer, multiple semiconductor bodies comprising:
a first semiconductor body having a first top surface, first opposing sidewalls and first opposing endwalls; and,
at least one second semiconductor body parallel to said first semiconductor body, said at least one second semiconductor body being longer than the first semiconductor body and having a second top surface, second opposing sidewalls and second opposing endwalls; and
forming a gate structure comprising:
a first gate stack traversing both said first semiconductor body and said second semiconductor body,
said first gate stack being adjacent to said first semiconductor body on said first top surface, on said first opposing sidewalls and on one of said first opposing endwalls, and
said first gate stack further being adjacent to said second semiconductor body on said second top surface and said second opposing sidewalls such that said second opposing endwalls are outside said first gate stack;
a second gate stack parallel to said first gate stack,
said second gate stack being positioned adjacent to a side of said first gate stack that covers said one of said first opposing endwalls so as to be physically separated from said first semiconductor body, and
said second gate stack further being adjacent to said second semiconductor body on said second top surface and said second opposing sidewalls such that said second opposing endwalls are outside said second gate stack; and
a connector parallel to said first semiconductor body and said second semiconductor body and electrically connecting said first gate stack and said second gate stack.

8. The method of claim 7, said forming of said gate structure comprising:
forming a conformal dielectric layer on said multiple semiconductor bodies;
forming a conductor layer on said conformal dielectric layer; and,
patterning said conformal dielectric layer and said conductor layer to form said gate structure.

9. The method of claim 7, wherein said first gate stack and said second gate stack have equal lengths, wherein a pitch between said first gate stack and said second gate stack is fixed and wherein a length of said first semiconductor body is selectively adjusted such that a length of an end portion of said first semiconductor body covered by said first gate stack ensures that said non-planar capacitor has a predetermined capacitance value.

10. The method of claim 7, said at least one second semiconductor body comprising multiple second semiconductor bodies all having a same length, said first gate stack and said second gate stack traversing said multiple second semiconductor bodies.

11. The method of claim 7,
said multiple semiconductor bodies further comprising:
additional semiconductor bodies comprising at least:
a first additional semiconductor body in end-to-end alignment with said first semiconductor body; and
a second additional semiconductor body in end-to-end alignment with said first additional semiconductor body; and
said gate structure further comprising a third gate stack and a fourth gate stack,
said second gate stack traversing a first end of the first additional semiconductor body,
said third gate stack being parallel and adjacent to said second gate stack, traversing a second end of said first additional semiconductor body opposite said first end and traversing said second semiconductor body,
said fourth gate stack being parallel and adjacent to said third gate stack and traversing both said second additional semiconductor body and said second semiconductor body, and
said connector further electrically connecting said third gate stack to said second gate stack and said fourth gate stack.

12. The method of claim 11, said first gate stack, said second gate stack, said third gate stack and said fourth gate stack having equal lengths and a uniform pitch.

13. A method of forming a non-planar capacitor, said method comprising:
forming a mandrel on a semiconductor layer above an isolation layer;
forming a sidewall spacer on vertical sidewalls of said mandrel such that said sidewall spacer laterally surrounds said mandrel;
selectively removing said mandrel;
performing a first etch process using said sidewall spacer as a first mask so as to form a continuous semiconductor body having side sections and end sections;

forming a second mask on said continuous semiconductor body, said second mask having at least one first opening exposing at least one region of one of said side sections and further having second openings exposing said end sections;

performing a second etch process to remove said at least one region of said one of said side sections and said end sections, said second etch process forming multiple semiconductor bodies, said multiple semiconductor bodies comprising:
- a first semiconductor body having a first top surface, first opposing sidewalls and first opposing endwalls; and,
- at least one second semiconductor body parallel to said first semiconductor body, said at least one second semiconductor body being longer than the first semiconductor body and having a second top surface, second opposing sidewalls and second opposing endwalls; and forming a gate structure comprising:
- a first gate stack traversing both said first semiconductor body and said second semiconductor body,
  - said first gate stack being adjacent to said first semiconductor body on said first top surface, on said first opposing sidewalls and on one of said first opposing endwalls, and
  - said first gate stack further being adjacent to said second semiconductor body on said second top surface and said second opposing sidewalls such that said second opposing endwalls are outside said first gate stack;
- a second gate stack parallel to said first gate stack,
  - said second gate stack being positioned adjacent to a side of said first gate stack that covers said one of said first opposing endwalls so as to be physically separated from said first semiconductor body, and
  - said second gate stack further being adjacent to said second semiconductor body on said second top surface and said second opposing sidewalls such that said second opposing endwalls are outside said second gate stack; and
- a connector parallel to said first semiconductor body and said second semiconductor body and electrically connecting said first gate stack and said second gate stack.

14. The method of claim 13, wherein a length of an end portion of said first semiconductor body covered by said first gate stack is selectively adjustable to selectively adjust a capacitance value of said non-planar capacitor.

15. The method of claim 13,
said gate structure being formed such that said first gate stack and said second gate stack have equal lengths and such that a pitch between said first gate stack and said second gate stack is fixed, and
said second mask being formed and said second etch process being performed in order to cut said one of said side sections at a predetermined location to selectively adjust a length of said first semiconductor body so that, when said gate structure is formed, a length of an end portion of said first semiconductor body covered by said first gate stack ensures that said non-planar capacitor has a predetermined capacitance value.

16. The method of claim 13,
said second mask being formed and said second etch process being performed in order to form, from said one of said side sections, additional semiconductor bodies comprising at least:
- a first additional semiconductor body in end-to-end alignment with said first semiconductor body, and
- a second additional semiconductor body in end-to-end alignment with said first additional semiconductor body, and said gate structure further comprising a third gate stack and a fourth gate stack,
- said second gate stack traversing a first end of the first additional semiconductor body,
- said third gate stack being parallel and adjacent to said second gate stack, traversing a second end of said first additional semiconductor body opposite said first end and traversing said second semiconductor body,
- said fourth gate stack being parallel and adjacent to said third gate stack and traversing both said second additional semiconductor body and said second semiconductor body, and
- said connector further electrically connecting said third gate stack to said second gate stack and said fourth gate stack.

17. The method of claim 16, said second mask being formed so as to compensate for mask overlay misalignment by forming said at least one first opening so as to expose at least one selected region of said one of said side sections, said at least one selected region extending laterally between and into designated channel regions within said one of said side sections.

18. The method of claim 16, said gate structure being formed such that said first gate stack, said second gate stack, said third gate stack and said fourth gate stack have equal lengths and a uniform pitch.

* * * * *